US010522731B2

(12) United States Patent
Sasaoka et al.

(10) Patent No.: US 10,522,731 B2
(45) Date of Patent: Dec. 31, 2019

(54) METHOD OF MANUFACTURING LIGHT EMITTING DEVICE AND LIGHT EMITTING DEVICE

(71) Applicant: NICHIA CORPORATION, Anan-shi (JP)

(72) Inventors: Shimpei Sasaoka, Tokushima (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/028,331

(22) Filed: Jul. 5, 2018

(65) Prior Publication Data

US 2018/0315914 A1    Nov. 1, 2018

Related U.S. Application Data

(63) Continuation of application No. 15/143,677, filed on May 2, 2016, now Pat. No. 10,050,186, which is a
(Continued)

(30) Foreign Application Priority Data

Jan. 20, 2012  (JP) ................................ 2012-010449

(51) Int. Cl.
*H01L 27/30*  (2006.01)
*H01L 33/62*  (2010.01)
(Continued)

(52) U.S. Cl.
CPC .............. *H01L 33/62* (2013.01); *H01L 33/38* (2013.01); *H01L 33/486* (2013.01); *H01L 33/54* (2013.01);
(Continued)

(58) Field of Classification Search
CPC combination set(s) only.
See application file for complete search history.

(56) References Cited

U.S. PATENT DOCUMENTS

| 2004/0089898 A1 | 5/2004 | Ruhnau et al. |
| 2005/0093005 A1 | 5/2005 | Ruhnau et al. |

(Continued)

FOREIGN PATENT DOCUMENTS

| JP | 63-178342 U | 11/1988 |
| JP | 2004-040099 | 2/2004 |

(Continued)

OTHER PUBLICATIONS

Japanese Office Action for corresponding JP Application No. 2012-010449, dated Sep. 15, 2015.
(Continued)

*Primary Examiner* — Moin M Rahman
(74) *Attorney, Agent, or Firm* — Mori & Ward, LLP

(57) ABSTRACT

A method of manufacturing a light emitting device includes providing molded packages each of which has a recess. A light emitting component is mounted on a bottom surface of the recess. At least one sealing member covering the light emitting component is formed within the recess. A lead frame including a first lead and a second lead is provided, the first lead having a first groove on an upper surface of the first lead the second lead having a second groove on an upper surface of the second lead. Spaces are formed, each of the spaces being surrounded with an upper metal mold, a lower metal mold, and the lead frame by cooperatively holding the lead frame with the upper metal mold and the lower metal mold. The spaces and the first groove and the second groove are filled with a resin.

5 Claims, 19 Drawing Sheets

Related U.S. Application Data continuation of application No. 13/744,586, filed on Jan. 18, 2013, now Pat. No. 9,357,641.

(51) Int. Cl.
*H05K 1/03* (2006.01)
*H01L 33/38* (2010.01)
*H01L 33/48* (2010.01)
*H01L 33/56* (2010.01)
*H01L 33/54* (2010.01)

(52) U.S. Cl.
CPC ........... *H01L 33/56* (2013.01); *H05K 1/0313* (2013.01); *H01L 2224/48091* (2013.01); *H01L 2224/48247* (2013.01); *H01L 2924/18301* (2013.01)

(56) References Cited

U.S. PATENT DOCUMENTS

| | | |
|---|---|---|
| 2005/0218531 A1 | 10/2005 | Ruhnau et al. |
| 2007/0159091 A1 | 7/2007 | Hirosaki et al. |
| 2008/0054287 A1 | 3/2008 | Oshio et al. |
| 2008/0224161 A1 | 9/2008 | Takada |
| 2008/0237627 A1 | 10/2008 | Kobayakawa |
| 2008/0298063 A1 | 12/2008 | Hayashi |
| 2009/0026482 A1 | 1/2009 | Ruhnau et al. |
| 2009/0114936 A1 | 5/2009 | Kashiwao et al. |
| 2009/0167153 A1 | 7/2009 | Hirosaki et al. |
| 2010/0078669 A1* | 4/2010 | Cho ................. H01L 33/46 257/98 |
| 2010/0155771 A1* | 6/2010 | Bando ................. H01L 24/97 257/99 |
| 2010/0264449 A1 | 10/2010 | Hayashi |
| 2010/0270571 A1 | 10/2010 | Seo |
| 2010/0314654 A1 | 12/2010 | Hayashi |
| 2010/0327307 A1 | 12/2010 | Ruhnau et al. |
| 2011/0180822 A1 | 7/2011 | Ruhnau et al. |
| 2011/0241028 A1 | 10/2011 | Park et al. |

FOREIGN PATENT DOCUMENTS

| | | |
|---|---|---|
| JP | 2004-349397 | 12/2004 |
| JP | 2005-235934 | 9/2005 |
| JP | 2007-194401 | 8/2007 |
| JP | 2008-060344 | 3/2008 |
| JP | 2008-251937 | 10/2008 |
| JP | 2009-135484 | 6/2009 |
| JP | 2010-062427 | 3/2010 |
| JP | 2011-119557 | 6/2011 |
| JP | 2011-146524 | 7/2011 |
| JP | 2011-151069 | 8/2011 |
| JP | 2012-084810 | 4/2012 |
| JP | 2013-125776 | 6/2013 |
| KR | 10-2009-0032869 | 4/2009 |

OTHER PUBLICATIONS

Office Action with Form PTO-892 Notice of References Cited issued by the United States Patent and Trademark Office for the corresponding U.S. Appl. No. 13/744,586, dated Nov. 10, 2014.
Office Action with Form PTO-892 Notice of References Cited issued by the United States Patent and Trademark Office for the corresponding U.S. Appl. No. 13/744,586, dated May 22, 2015.
Office Action with Form PTO-892 Notice of References Cited issued by the United States Patent and Trademark Office for the corresponding U.S. Appl. No. 15/143,700, dated Mar. 22, 2017.
Office Action with Form PTO-892 Notice of References Cited issued by the United States Patent and Trademark Office for the parent U.S. Appl. No. 15/143,677, dated Mar. 22, 2017.
Office Action with Form PTO-892 Notice of References Cited issued by the United States Patent and Trademark Office for the parent U.S. Appl. No. 15/143,677, dated Nov. 2, 2017.
Notice of Allowance with Form PTO-892 Notice of References Cited issued by the United States Patent and Trademark Office for the corresponding U.S. Appl. No. 13/744,586, dated Feb. 4, 2016.
Notice of Allowance with Form PTO-892 Notice of References Cited issued by the United States Patent and Trademark Office for the corresponding U.S. Appl. No. 15/143,700, dated Nov. 3, 2017.
Notice of Allowance with Form PTO-892 Notice of References Cited issued by the United States Patent and Trademark Office for the parent U.S. Appl. No. 15/143,677, dated Apr. 11, 2018.

* cited by examiner

METHOD OF MANUFACTURING LIGHT EMITTING DEVICE AND LIGHT EMITTING DEVICE

CROSS-REFERENCE TO RELATED APPLICATIONS

The present application is a continuation application of the U.S. patent application Ser. No. 15/143,677, filed May 2, 2016, which is a continuation application of the U.S. patent application Ser. No. 13/744,586, filed Jan. 18, 2013, which issued as the U.S. Pat. No. 9,357,641, which claims priority under 35 U. S. C. § 119 to Japanese Patent Application No. 2012-010449, filed Jan. 20, 2012. The contents of these applications are incorporated herein by reference in their entirety.

BACKGROUND OF THE INVENTION

Field of the Invention

The present invention relates to a method of manufacturing a light emitting device and a light emitting device.

Description of the Related Art

A frame insert type resin package for a light emitting device having such a configuration that a lead is exposed from a rear surface of a molded resin to enable an effective heat discharge from a light emitting component mounted on a recess portion of the package to a mounted substrate via the lead (see, JP 2008-251937 A) is known. Such a package that formation of an anchor groove on the lead and the subsequent filling of the molded resin into the anchor groove cause an adhesion area between the lead and the molded resin to increase is also known (see, for example, JP 2011-146524 A).

SUMMARY OF THE INVENTION

According to one aspect of the present invention, a method of manufacturing a light emitting device includes providing a plurality of molded packages, each of the molded packages having a recess. A light emitting component is mounted on a bottom surface of the recess of each of the molded packages. At least one sealing member covering the light emitting component is formed within the recess of each of the molded packages. The plurality of molded packages are provided by: preparing a lead frame including a plurality of pairs of leads, each of the pairs of leads including a first lead having a first groove on an upper surface of the first lead and a second lead having a second groove on an upper surface of the second lead; forming a plurality of spaces, each of the spaces being surrounded with an upper metal mold and a lower metal mold and the lead frame by cooperatively holding the lead frame with the upper metal mold and the lower metal mold, wherein the upper metal mold has a plurality of convex portions on a lower surface of the upper metal mold, each of the convex portions having chamfered corners at a lower surface of each of the convex portions, wherein the lower surface of each of the convex portions is in contact with upper surfaces of each of the pairs of leads so that the chamfered corners of the convex portion face to the first groove and the second groove of each of the pair of leads, wherein an upper surface of the lower metal mold is in contact with lower surfaces of the plurality of the pairs of leads, and wherein each of the spaces communicates with the first groove and the second groove of each of the pair of leads; and filling with a resin the plurality of the spaces and the first groove and the second groove of the plurality of pairs of leads.

According to another aspect of the present invention, a light emitting device includes a molded package, a light emitting component, and at least one sealing member. The molded package includes leads, a molded resin, and a recess. The leads include a pair of a first lead and a second lead. An upper surface of the leads is partially exposed from a bottom surface of the recess. The light emitting component is mounted on the bottom surface of the recess. The at least one sealing member is located in the recess to cover the light emitting component. At least one of the first lead and the second lead has a groove on an upper surface of the at least one of the first lead and the second lead. The groove is positioned so as to correspond to a corner on bottom side of the recess of the mold package in a cross sectional view. A portion of the molded resin located within the groove is exposed form the bottom surface of the recess. A surface of the corner of the recess is composed of a curved surface. The sealing member covers the corner of the recess.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
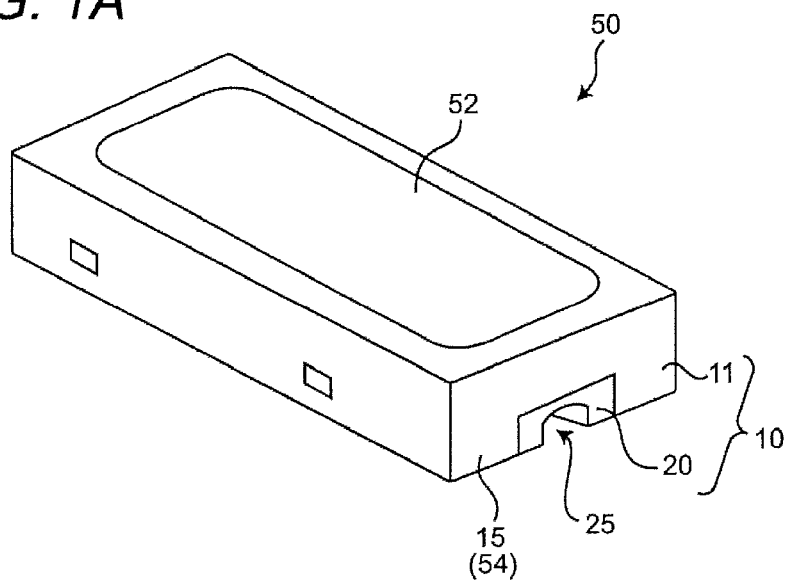
FIG. 1A is a perspective view of a top surface of the light emitting device according to the present embodiment and FIG. 1B is a perspective view of a rear surface thereof.

The embodiments will now be described with reference to the accompanying drawings, wherein like reference numerals designate corresponding or identical elements throughout the various drawings.

In the present embodiment, technical terms such as "inside", "outside", "upper edge", and "below" indicate a position and a direction with reference to a center of the bottom surface of the recess portion.

In the present embodiment, the "inside upper edge" of the groove is an edge portion near the center of the bottom surface of the recess portion of the molded resin among two edge portions (i.e., upper edges) opposing to each other in a width direction in an opening of the groove and the "outside upper edge" indicates an edge portion away from the center of the bottom surface of the recess portion of the molded resin.

The "groove" of the present embodiment indicates a groove which is formed into a recess shape and is configured such that, in the opening in the surface of the lead, a side wall of the recess portion of the molded resin opposes to an inside upper edge. Preferably, the opening of the groove has almost a constant width throughout the groove. However, a distance between the side wall of the recess portion of the molded resin and the inside upper edge and a width of the opening may be configured to be partially larger or smaller.

Figure 1B:
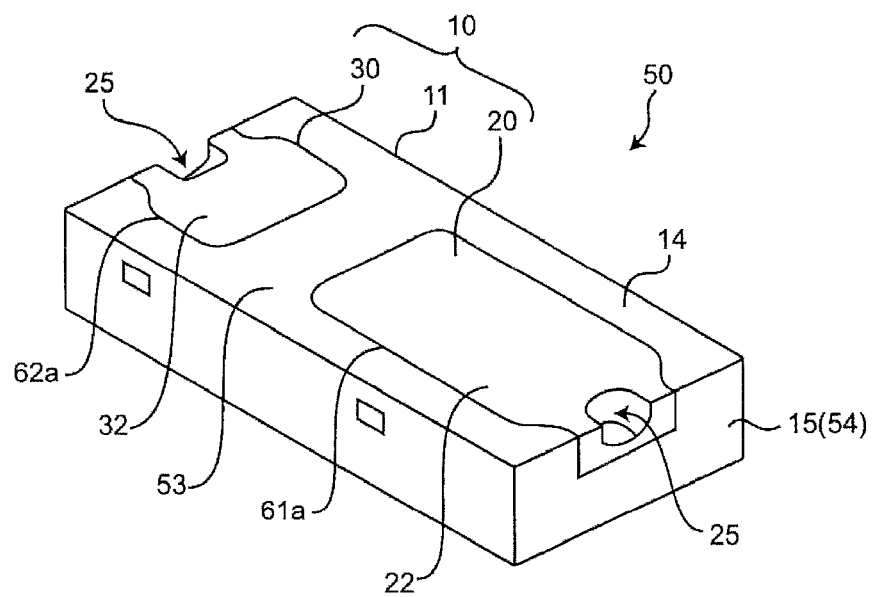
Figure 2:
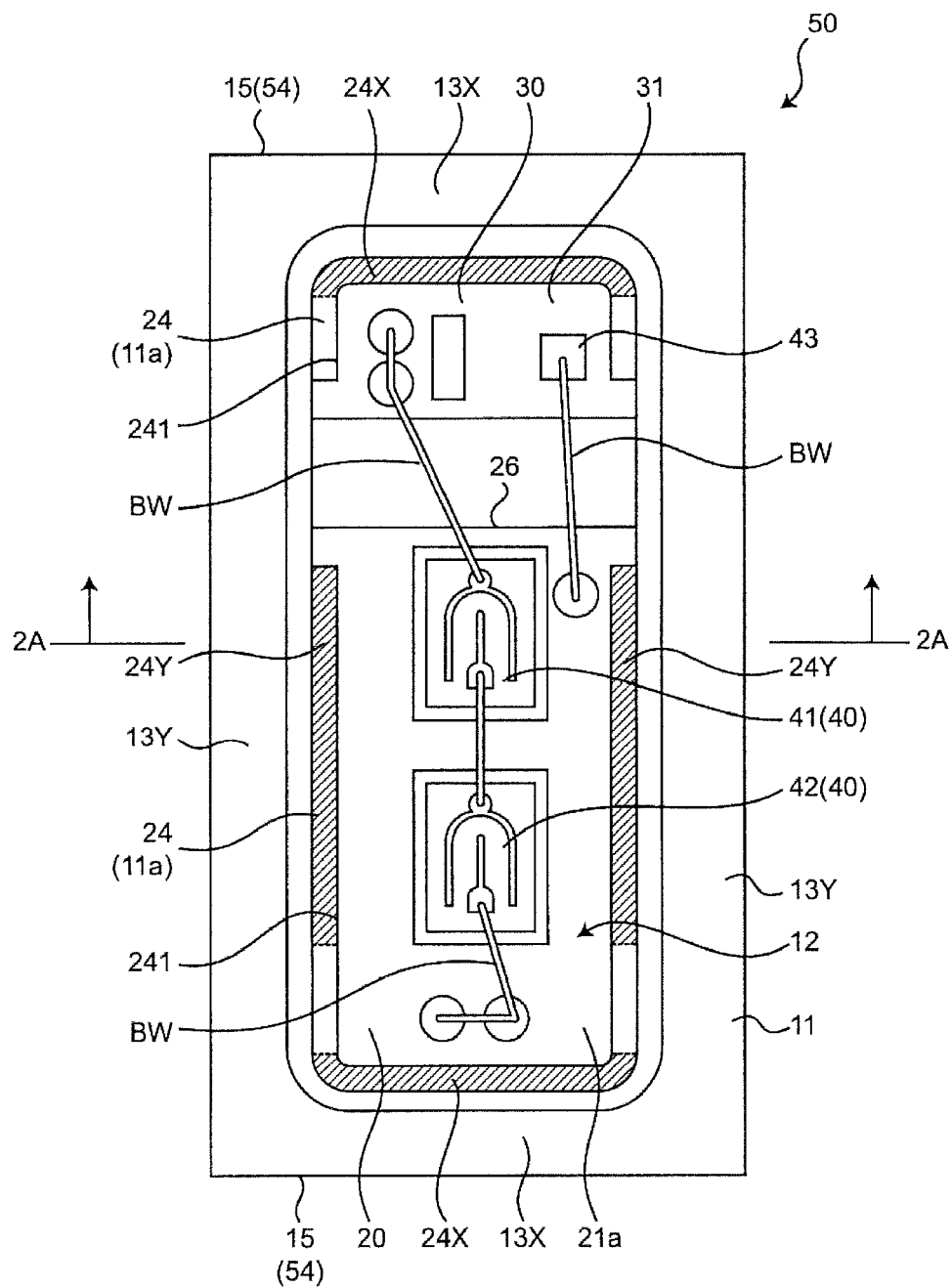
FIG. 2 is a top surface view when a sealing resin of the light emitting device according to the present embodiment is removed.
Figure 3:
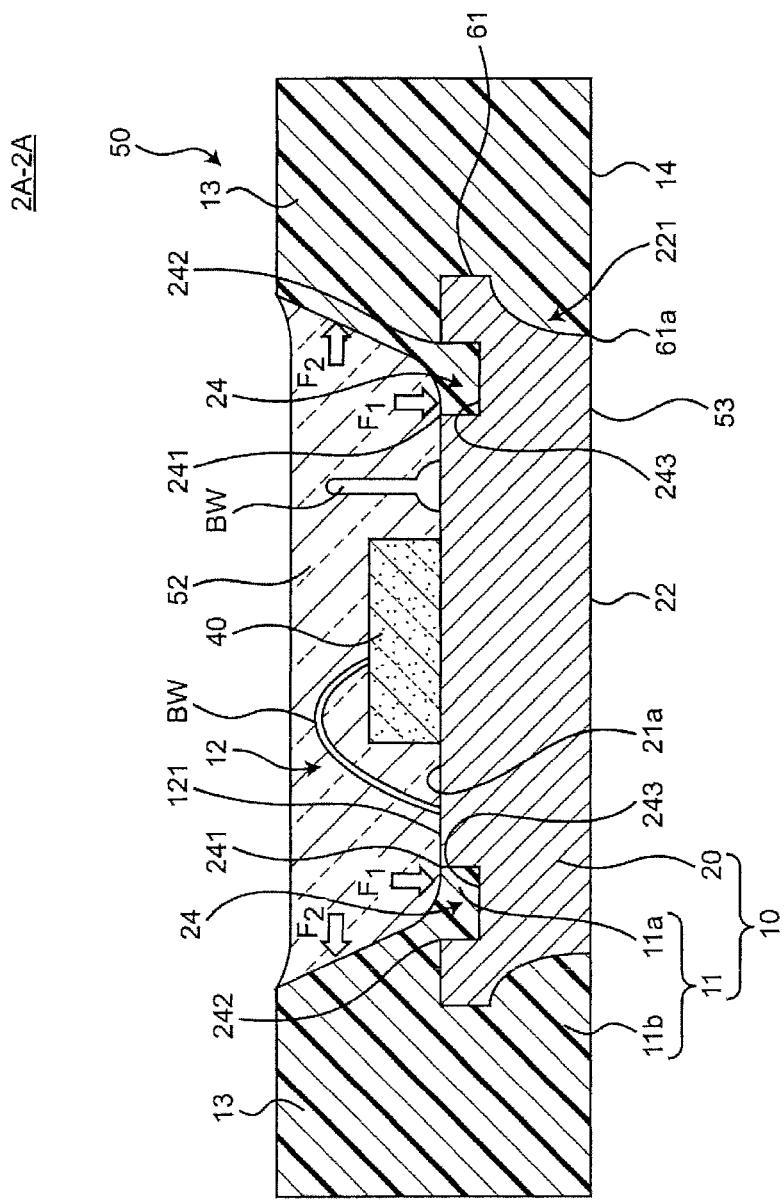
FIG. 3 is a cross sectional view of the light emitting device of FIG. 2 taken along line 2A-2A.

As illustrated in FIGS. 1 to 3, a light emitting device 50 according to the present embodiment includes a molded package 10, a light emitting component 40, and a sealing resin 52.

In the present embodiment, the "light emitting component 40" indicates a component involving a light emitting element and includes the light emitting element (e.g., a LED) itself and a component composed of the light emitting element and a submount. In the present embodiment, the light emitting component 40 consists of a light emitting element.

The sealing resin 52 seals a recess portion 12 of a molded resin 11 after accommodating the light emitting component 40 in the recess portion 12 in order to protect the light emitting component 40 from the external environment.

A molded package 10 according to the present embodiment includes a molded resin 11 and at least one lead (i.e., two leads 20 and 30 in the present embodiment).

The molded resin 11 has a recess portion 12 on a top surface thereof in order to accommodate the light emitting component 40 in the recess portion 12. The recess portion 12 is enclosed by side wall 13.

The leads 20 and 30 are partially exposed from a bottom surface 121 of the recess portion 12 of the molded resin 11 and extend downward the side wall 13 of the recess portion 12 of the molded resin 11 (see, FIGS. 2 and 3). The two leads 20 and 30 are spaced to each other and a section therebetween is filled with the molded resin 11.

In the light emitting device 50 of the present embodiment, an exposed surface 21a of one of the leads (i.e., the first lead) 20 is provided with one or more (i.e., two in FIG. 2) light emitting component 40 (41 and 42). The second lead 30 is used as an area for wire bonding and is provided with a zener diode 43 disposed thereon. The second lead 30 has a recess portion between the area for the wire bonding and the area provided with the zener diode disposed thereon, thereby improving the adhesion area between the second lead 30 and the sealing resin. The recess portion of the second lead is formed so as to be connected to a below described groove 24X to be filled with the molded resin 11, thereby preventing a joint member of the zener diode from eroding the area for wire bonding.

The light emitting component 40, the first lead 20, and the second lead 30 are electrically connected to each other via a bonding wire BW. As illustrated in FIG. 2, when the light emitting device includes two light emitting components 41 and 42, the wire bonding may be configured such that the first light emitting component 41 is connected to the first lead 20 via the bonding wire BW, the second light emitting component 42 is connected to the second lead 30 via the bonding wire BW, and further first light emitting component 41 is connected to the second light emitting component 42 via the bonding wire BW (i.e., the series wiring). Alternatively, each of the two light emitting components 41 and 42 may be connected to the first lead 20 and the second lead 30, respectively, via the bonding wire BW (i.e., the parallel wiring).

As illustrated in FIG. 2, the first lead 20 and the second lead 30 has grooves 24 formed on surfaces 21, and 31 of the leads along at least portions of the side wall 13 (i.e., a peripheral area). Each groove 24 has an inside upper edge 241 and an outside upper edge 242.

Figure 6:
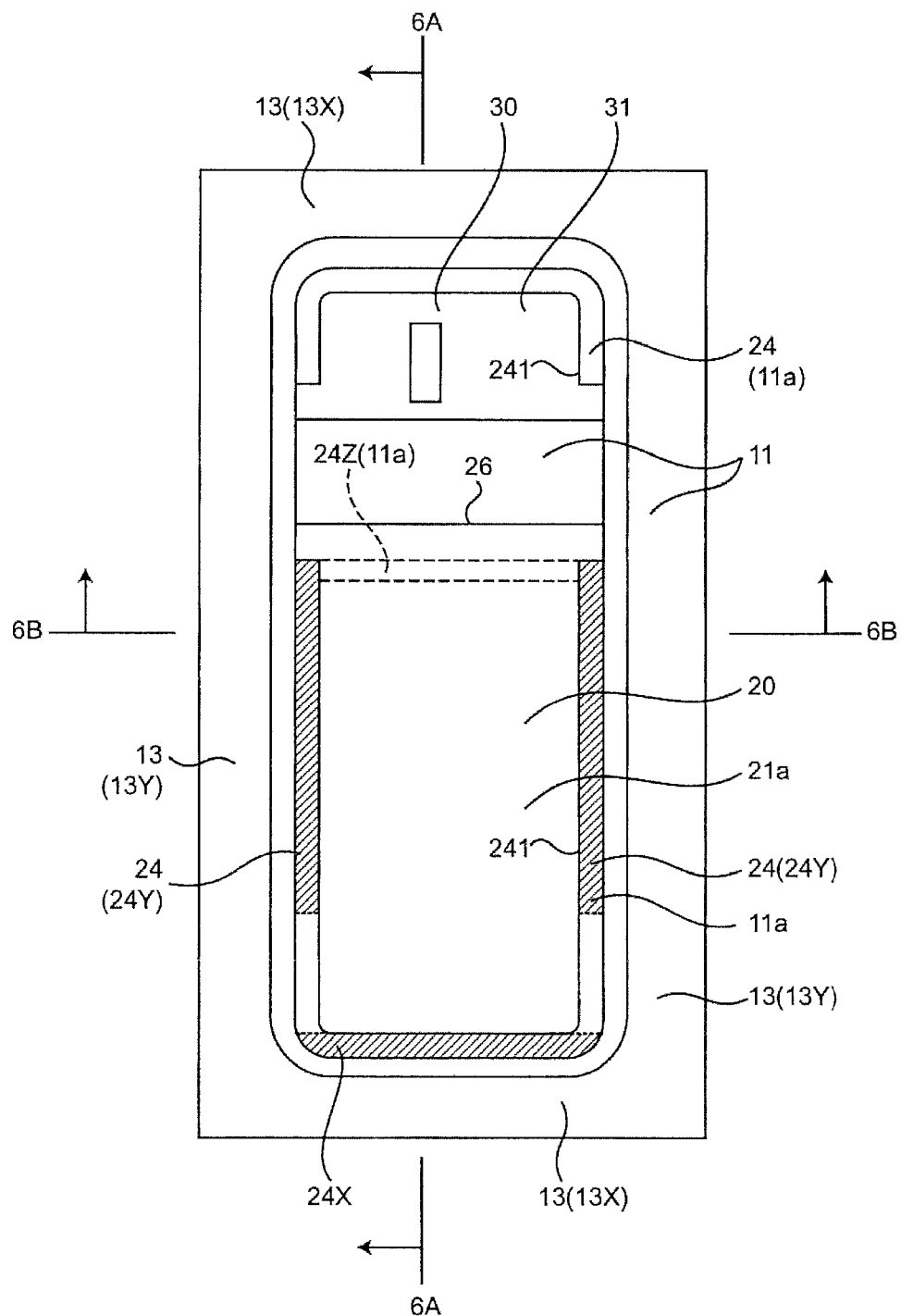
FIG. 6 is a top view of the molded package according to the present embodiment.

In the present embodiment, the "at least a portion of the side wall" indicates "a portion of a periphery" of inner surfaces of the side wall 13 disposed peripherally (i.e., formed into a closed ring shape) when viewed from a top thereof, as shown in FIG. 6.

In the preset embodiment, the inside upper edge 241 of each groove 24 is exposed from the bottom surface 121 of the recess portion 12 of the molded resin 11 and the outside upper edge 242 of each groove 24 is embedded within the molded resin 11. For example, as illustrated in FIG. 3, skirt portions of the side wall 13 of the recess portion 12 (i.e., a portion of the molded resin 11) are embedded within the groove 24 to form a portion of a bottom surface 121 of the recess portion 12. A portion of the molded resin 11 (i.e., a portion of the groove filled with the resin 11a) is substantially filled in the groove 24 in its entirety.

In the present embodiment, the inside upper edge 241 of each groove 24 is exposed from the bottom surface 121 of the recess portion 12 of the molded resin 11 and the outside upper edge 242 of each groove 24 is embedded within the molded resin 11, so that the portion of the groove filled with the resin 11a within the groove 24 is connected to the body 11b of the molded resin 11 at a side of the outside upper edge 242 when viewed from the cross section (FIG. 3) and the portion of the groove filled with the resin 11a appears to be a portion of the bottom surface 121 of the recess portion 12 at a side of the inside upper edge 241 when viewed from the top surface.

As illustrated in FIG. 3, an area of a side of the inside upper edge 241 (i.e., an area exposed from the bottom surface 121 of the recess portion 12) of a surface 21a of the first lead 20 and the portion of the groove filled with the resin 11a are smoothly continues in the inside upper edge 241, i.e., substantially has no step. The area on the side of the inside upper edge 241 can be configured only with a curved surface but is preferably at least partially formed with a horizontal surface in flush with the exposed surface 21a of the lead 20 (e.g., adjacent portion of the inside upper edge 241). The area on the side of the inside upper edge 241 of the portion of the groove filled with the resin 11a is pressed by a stress $F_1$ during the reflow soldering. At the time, if the area on the side of the inside upper edge 241 includes a horizontal portion, the stress $F_1$ is oriented vertically (i.e., vertically downwardly) with respect to the horizontal surface (detailed description follows below).

As illustrated in FIGS. 1A and 3, the first lead 20 and the second lead 30 are preferably exposed from a rear surface 14 of the molded resin 11. Accordingly, heat generation by the light emitting element 40 can be effectively discharged to the outside of the recess portion 12 via the first lead 20 and the second lead 30. With such a configuration, an edge portion of a boundary surface 61 (i.e., a boundary 61a) between the first lead 20 and the molded resin 11 and an edge portion of a boundary surface 62 (i.e., a boundary 62a) between the second lead 30 and the molded resin 11 are exposed from the rear surface 14 of the molded resin 11. The boundary surfaces 61 and 62 extends through an area between the bottom surface 243 of the groove 24 and the portion of the groove filled with the resin 11a so as to be successive into the recess portion 12 of the molded package 10.

Figure 17:
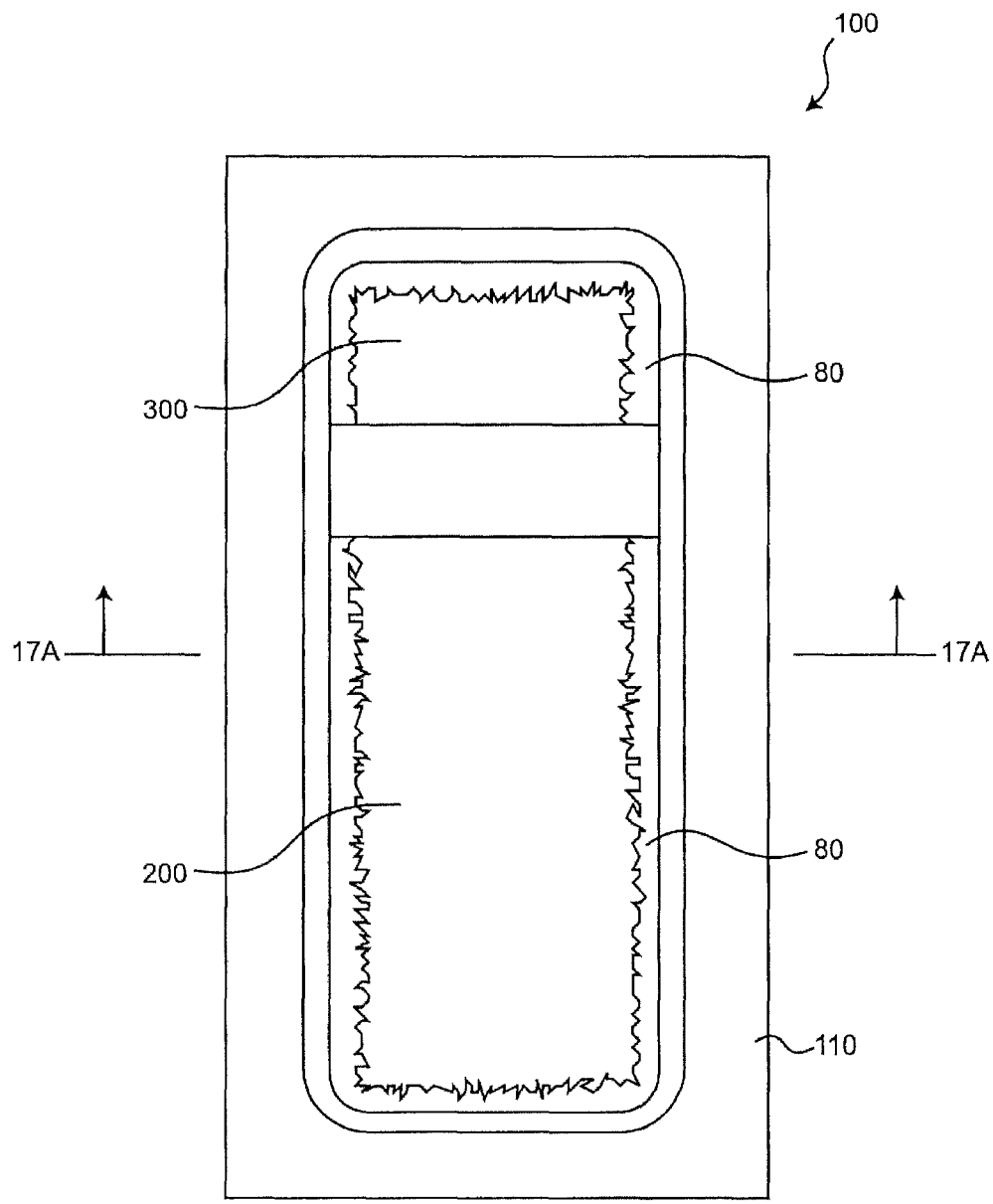
FIG. 17 is a top view of the molded package according to the comparative example.
Figure 18:
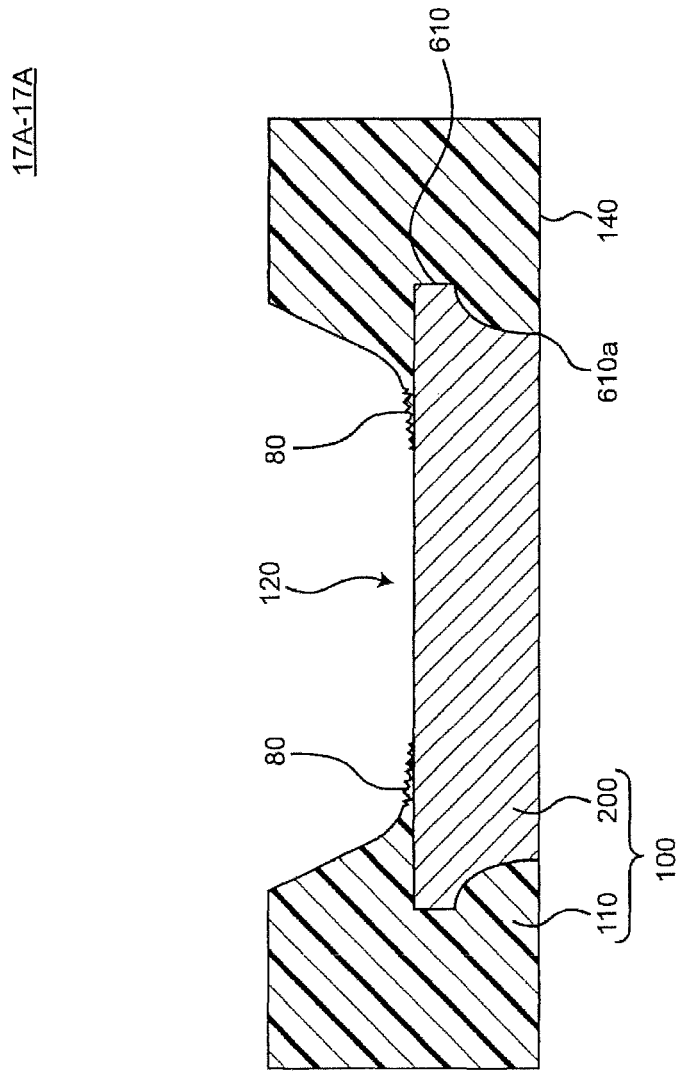
FIG. 18 is cross sectional view of the molded package according to the comparative example.

With a molded package 100 (see, FIGS. 16 to 18) according to the comparative example, if the light emitting device having a configuration illustrated in FIG. 3 is manufactured, the soldering flux molten according to the reflow soldering may extend from a boundary 610a of a rear surface 140 of the molded package 100 to reach a recess portion 120 through a boundary surface 610 when the light emitting device is mounted on the mounted substrate.

On the other hand, in the light emitting device 50 according to the present embodiment, the sealing resin 52 filled into the recess portion 12 of the molded package 10 expands by heat during the reflow soldering to generate a stress $F_1$ that presses the area on the side of the inside upper edge 241 of the portion of the groove filled with the resin 11a (i.e., the area exposed from the bottom surface 121 of the recess portion 12) downwardly (i.e., toward the bottom surface 243 of the groove 24). Further, the molded resin 11 also expands so that the portion of the groove filled with the resin 11a presses side surfaces and the bottom surface 243 within the groove 24. In other words, due to the synergistic effect between the thermal expansion of the sealing resin 52 and the thermal expansion of the portion of the groove filled with the resin 11a, the stress that the portion of the groove filled with the resin 11a presses downwardly (i.e., toward the bottom surface 243 of the groove 24) increases. Accordingly, especially, inbetween the portion of the groove filled with the resin 11a and the bottom surface 243 of the groove 24 of the boundary surface 61, the adhesion becomes stronger and thus high restraint exercises against the invasion of the soldering flux. As a result thereof, a disadvantage that the soldering flux reaches the recess portion 12 can be decreased in comparison with a case of the light emitting device using the molded package 100.

A direction of the stress $F_1$ is vertical with respect to a surface of the portion of the groove filled with the resin 11a. Consequently, as illustrated in FIG. 3, if at least the area adjacent to the inside upper edge 241 of the surface of the portion of the groove filled with the resin 11a is formed into a horizontal surface in flush with the exposed surface 21a of the lead 20, the stress $F_1$ applied to the horizontal surface is oriented in a vertical downward direction. As a result thereof, a contact surface between the portion of the groove filled with the resin 11a and the bottom surface 243 of the groove 24 can be preferably effectively tightly adhered to each other.

When the surface of the portion of the groove filled with the resin 11a is formed into a curved surface, the stress $F_1$ applied to the curved surface in a direction perpendicular to a tangential line direction of the curved surface is oriented obliquely with respect to a contact surface between the portion of the groove filled with the resin 11a and the bottom surface 243 of the groove 24. As a result thereof, an effect of adhesion of the contact surface can be produced owing to a component in a vertical downward direction of the stress $F_1$.

Since the stress $F_1$ for pressing the portion of the groove filled with the resin 11a downwardly is generated during the reflow soldering, the molded resin 11 can be effectively prevented from being separated from the first lead 20 and the second lead 30. More specifically, the side wall 13 of the molded resin 11 are applied with the outwardly acting stress $F_2$ due to the thermal expansion of the sealing resin 52 during the reflow soldering. The stress $F_2$ can act so as to separate the molded resin 11 from the first lead 20 and the second lead 30.

However, in the present embodiment, the generation of the stress $F_1$ that presses the portion of the groove filled with the resin 11a downwardly allows tight bonding of the molded resin 11 with respect to the first lead 20 and the second lead 30. In comparison with the anchor groove which is completely embedded into the molded package as discussed in JP 2011-146524 A, an effect to prevent the molded resin 11 from being separated from the first lead 20 and the second lead 30 can be enhanced by providing the groove 24 exposed at the inside upper edge 241 according to the present embodiment.

In the light emitting device 50 according to the present embodiment, since an area of the joining portion between the sealing resin 52 and the molded resin 11 increases according to the portion of the groove filled with the resin 11a within the groove 24, a joining force between the sealing resin 52 and the molded package 10 can be made stronger.

The sealing resin 52 is fixed to the molded package 10 such that the sealing resin 52 is bonded to the molded resin 11, the first lead 20, and the second lead 30 exposed in the recess portion 12. The sealing resin 52 is more strongly bonded to the molded resin 11 than the leads 20 and 30. Therefore, as an area at which the sealing resin 52 and the molded resin 11 are joined increases, a bonding force between the sealing resin 52 and the molded package 10 becomes stronger.

A direction of the joining area between the sealing resin 52 and the molded resin 11 (i.e., a direction orthogonal to a tangential line direction of the area) is different from each other between a portion between the side wall 13 and the sealing resin 52 and a portion between the portion of the groove filled with the resin 11a and the sealing resin 52 in the joining area. Therefore, a resistance force against the stress applied to the sealing resin 52 also differs. As a result thereof, when a stress is applied in a direction in which the sealing resin 52 is separated from the molded package 10, a resistance force against the stresses from all the directions improves because the resistance force generated between the side wall 13 and the sealing resin 52 and the resistance force generated between the portion of the groove filled with the resin 11a and the sealing resin 52 complement to each other.

Therefore, manufacturing of the light emitting device 50 by using the molded package 10 according to the present embodiment enables to prevent the sealing resin 52 from being separated from the molded package 10.

Figure 16:
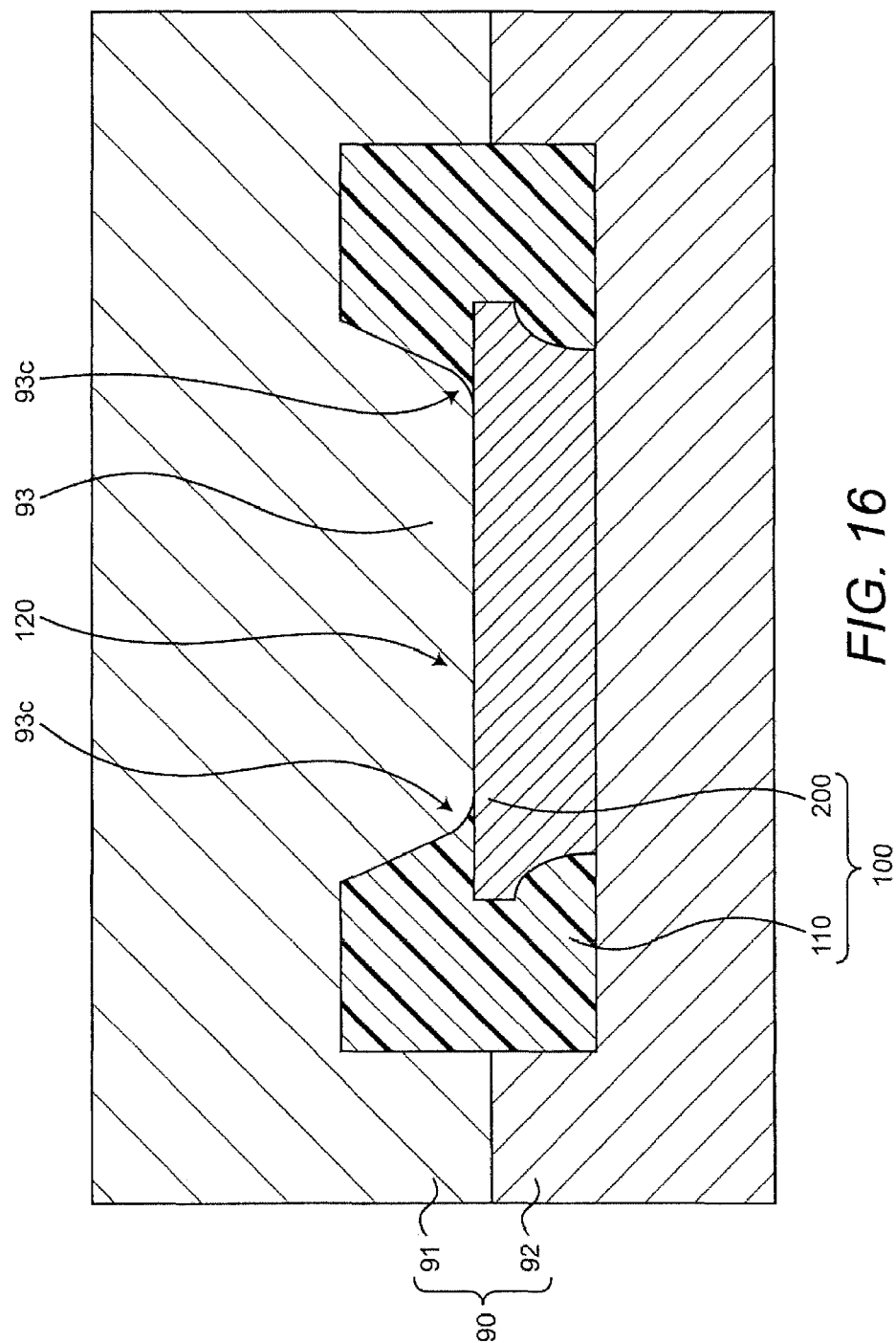
FIG. 16 is a cross sectional view for illustrating molding process of the molded package according to a comparative example.

As illustrated in FIG. 16, a molded resin 110 of a molded package 100 according to the comparative example is manufactured according to molding by using a metal mold 90 consisting of an upper metal mold 91 and a lower metal mold 92. More specifically, a space of the metal mold 90 is filled with molten resin while the leads 200 and 300 are held between the upper metal mold 91 and the lower metal mold 92. The upper metal mold 91 has a convex portion 93 corresponding to a recess portion 120 of the molded resin 110. It is desirable that no invasion of the molten resin occurs into an area (i.e., the metal mold-lead contact area) where a surface of the convex portion 93 and surfaces of the leads 200 and 300 directly contact to each other. However, chamfering (i.e., R chamfering or C chamfering) is provided to corners 93c of the convex portion 93 of the upper metal mold 91, thereby attempting to improve releasability of the upper metal mold 91. If the metal mold 90 is used for molding, burr of the molded resin 110 is formed on surfaces of the leads 200 and 300 exposing the recess portion 120 of the molded resin 110 (see, FIGS. 17 and 18). The burr may be formed for the reasons as described below.

Figure 19:
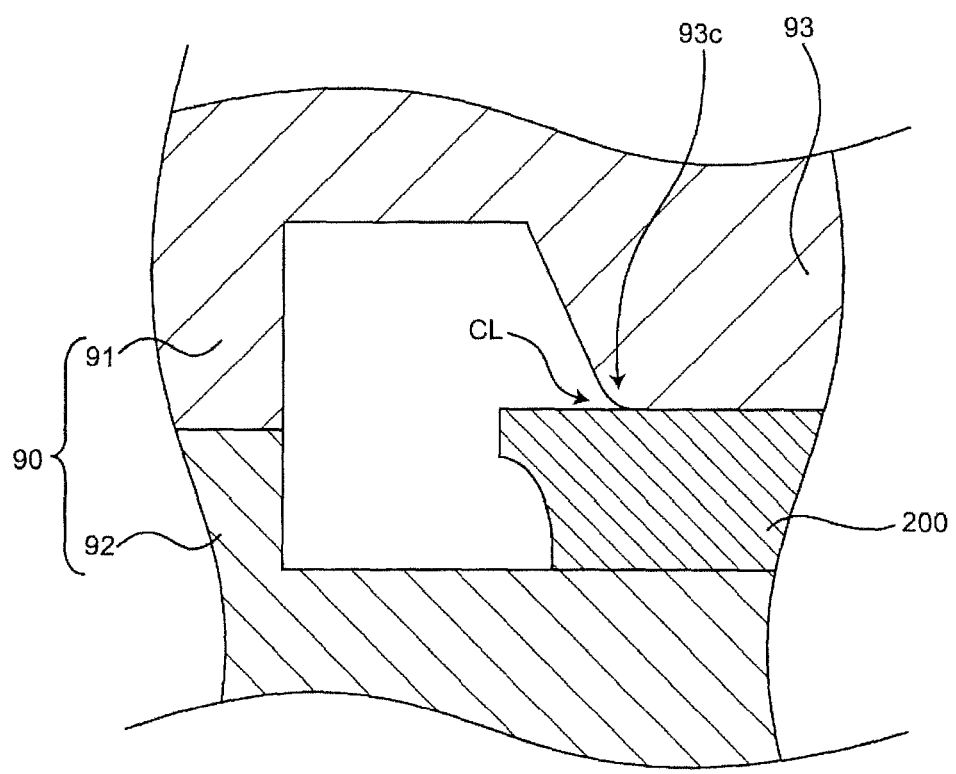
FIG. 19 is a cross sectional view illustrating a state of the molded package according to the comparative example before being subjected to the molding process.

As illustrated in FIG. 19, when the corner 93c of the convex portion 93 of the upper metal mold 91 is subjected to chamfering processing, a clearance CL having a sharp angle is created between the corner 93c and each of the leads 200 and 300. Upon injection of the molten resin into the metal mold 90, a stress is applied concentrically to a top of the clearance CL from the molten resin and, therefore, the molten resin oozes out into a metal mold-lead contact area from a top of the clearance CL. The molten resin oozing out from the top of the clearance CL becomes a burr 80 after curing the molten resin.

Spreading of the burr 80 over the leads 200 and 300 invites a poor bonding upon die bonding between the first lead 200 and the light emitting component and a poor bonding upon wire bonding between the second lead 300 and the light emitting component. Since the burr 80 is formed into an irregular shape, the burr 80 causes disfigurement of the recess portion 120 of the molded package 100 when viewing from a top thereof (see, FIG. 17).

In the light emitting device 50 according to the present embodiment, however, the burr is less generated on the bottom surface 121 of the recess portion 12 of the molded package 10. The reasons thereof follow.

Figure 4:
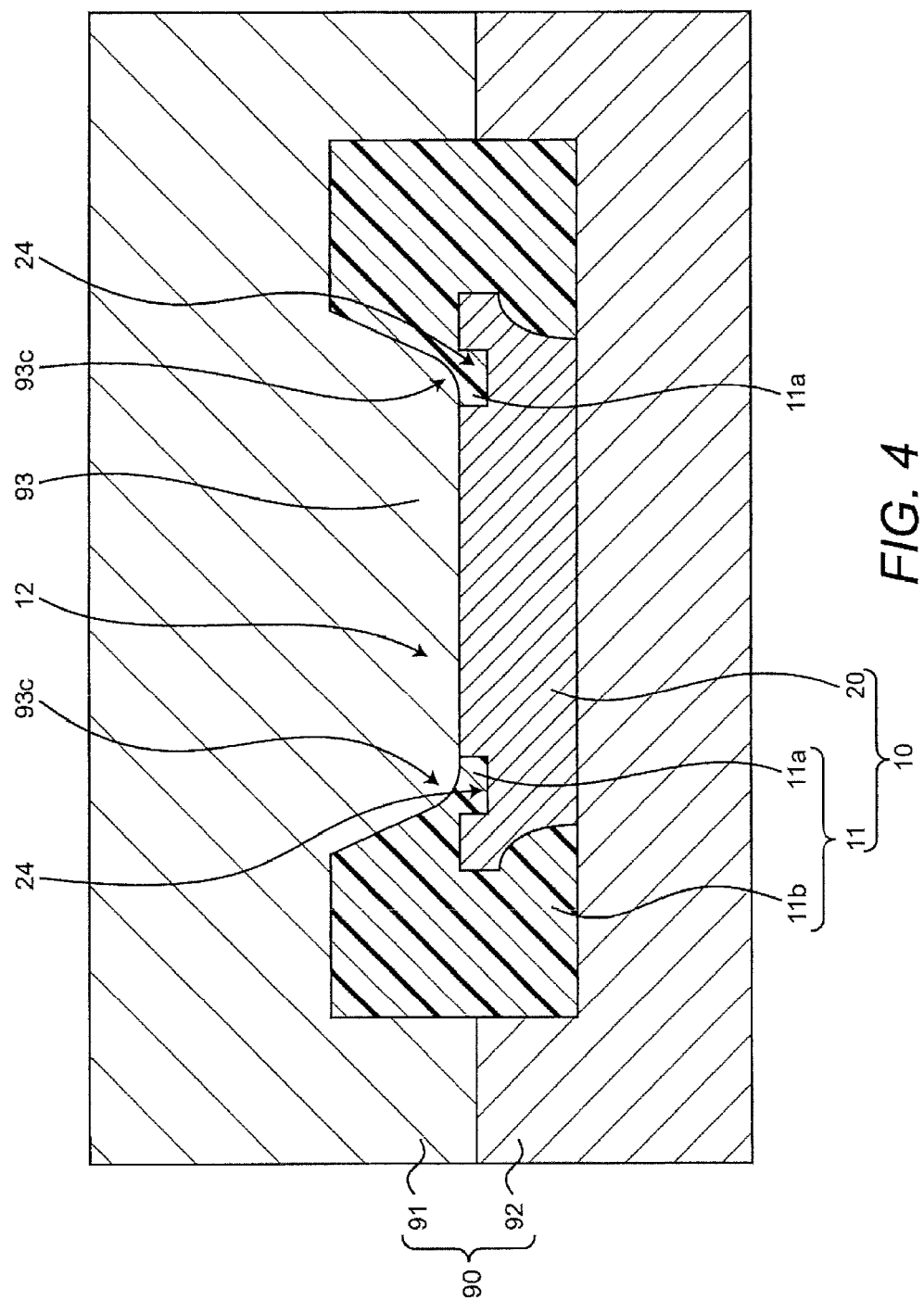
FIG. 4 is a cross sectional view illustrating a molding process of the molded package, according to the present embodiment.
Figure 5:
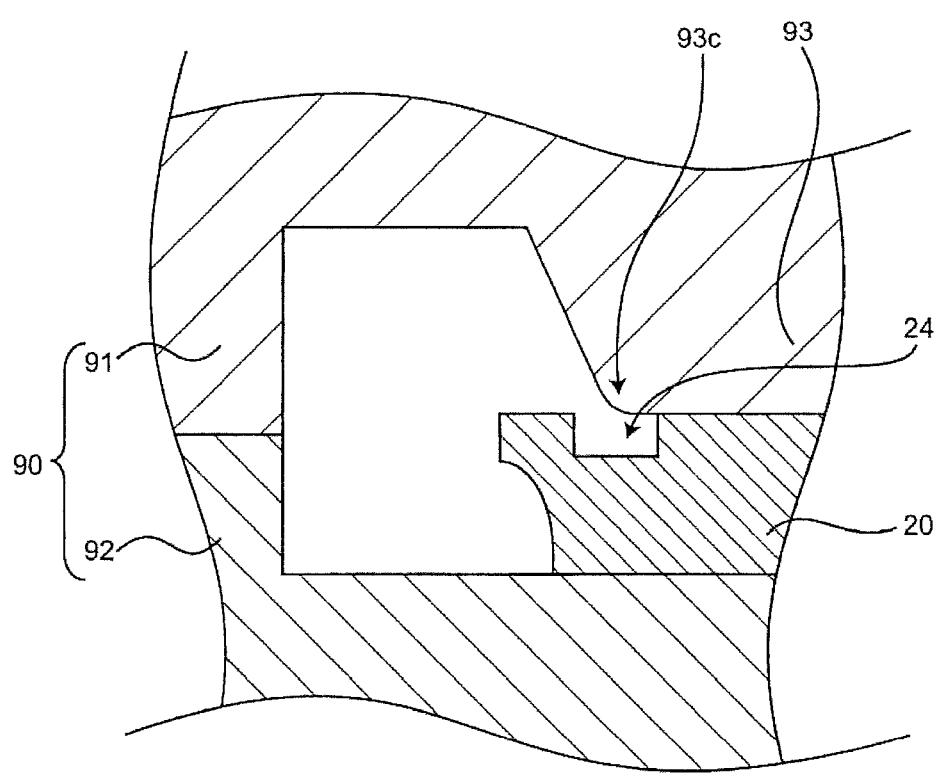
FIG. 5 is a cross sectional view for illustrating the molding process of the molded package according to the present embodiment.

The molded resin 11 of the molded package 10 is molded by using the metal mold 90 consisting of the upper metal mold 91 and the lower metal mold 92 (see, FIGS. 4 and 5). The upper metal mold 91 has a convex portion 93 corresponding to the recess portion 12 of the molded resin 11. Corners 93c of the convex portion 93 are subjected to the chamfering processing (i.e., R-chamfering processing or C-chamfering processing).

As illustrated in FIG. 4, the upper metal mold 91 and the lower metal mold 92 cooperatively hold the first lead 20 as well as cooperatively hold the second lead 30 during the molding of the molded resin 11. At the time, as illustrated in FIG. 5, since the groove 24 is positioned immediately below the corner 93c of the convex portion 93 of the upper metal mold 91, no clearance CL having a sharp angle (see, FIG. 19) is formed between the corner 93c and the leads 20 and 30. In other words, there is no portion at which the stress tends to be concentrated at the time of filling the molten resin into the metal mold 90 (e.g., no top of the clearance CL having a sharp angle). Therefore, the molten resin does not ooze out into the area where the metal mold 90 contacts the first lead 20 (and the area where the metal mold 90 contacts the second lead 30), so that no burr 80 of the molded resin 11 (see, FIGS. 17 and 18) is generated on the surfaces of the first lead 20 and the second lead 30.

Figure 7:
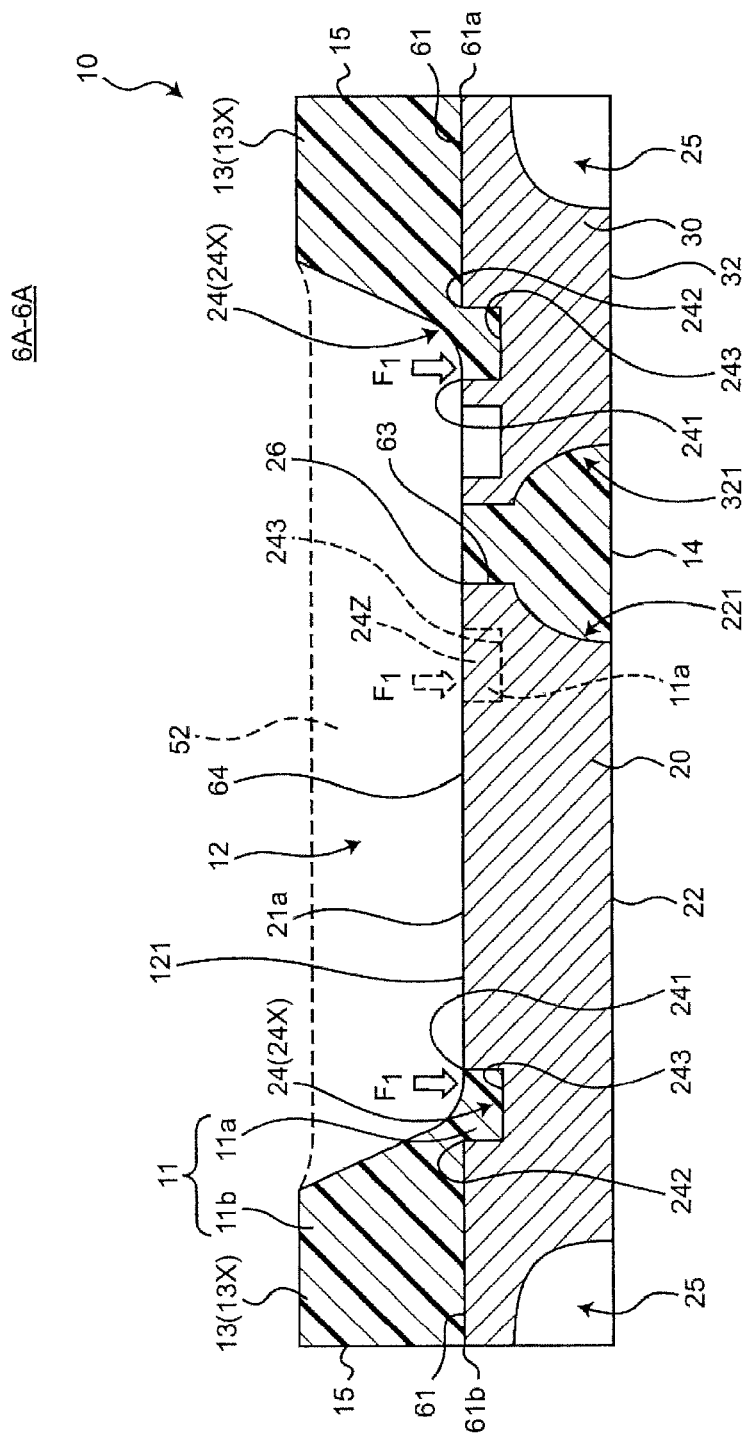
FIG. 7 is a cross sectional view of the molded package of FIG. 6 taken along line 6A-6A.
Figure 8:
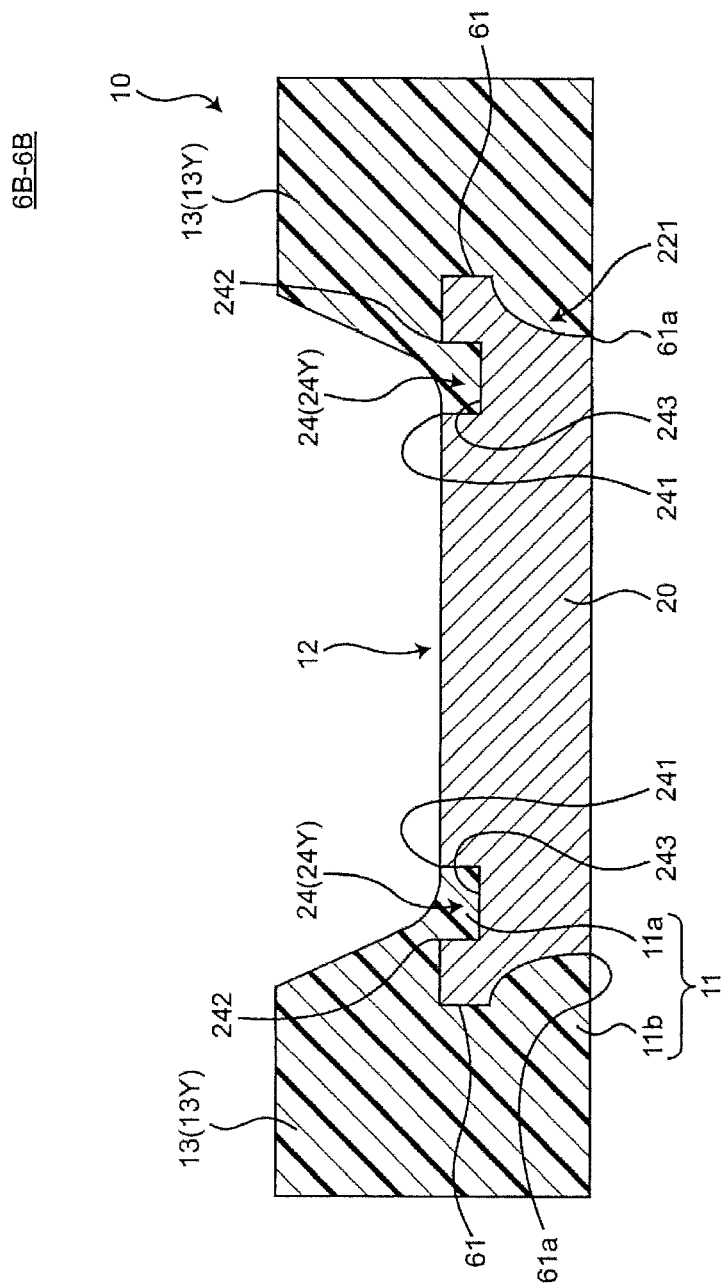
FIG. 8 is a cross sectional view of the molded package of FIG. 6 taken along line 6B-6B.

In the resulting molded package 10, no burr is generated at the boundary between the molded resin 11 (11a) and the surfaces 21 and 31 of the leads 20 and 30, so that the boundary matches the inside upper edge 241 of the groove 24 (see, FIGS. 6 through 8).

As described above, in the molded package 10 according to the present embodiment, the groves 24 provided on the leads 20 and 30 are positioned immediately under the corners 93c of the convex portion 93 of the upper metal mold 91 during the manufacturing of the molded package 10. As a result thereof, the burr 80 can be effectively prevented from being generated. Therefore, in the light emitting device 50 using the molded package 10 according to the present embodiment, poor bonding due to the burr 80 does not occur and, therefore, the burr 80 shall not spoil the appearance of the light emitting device 50.

Figure 9:
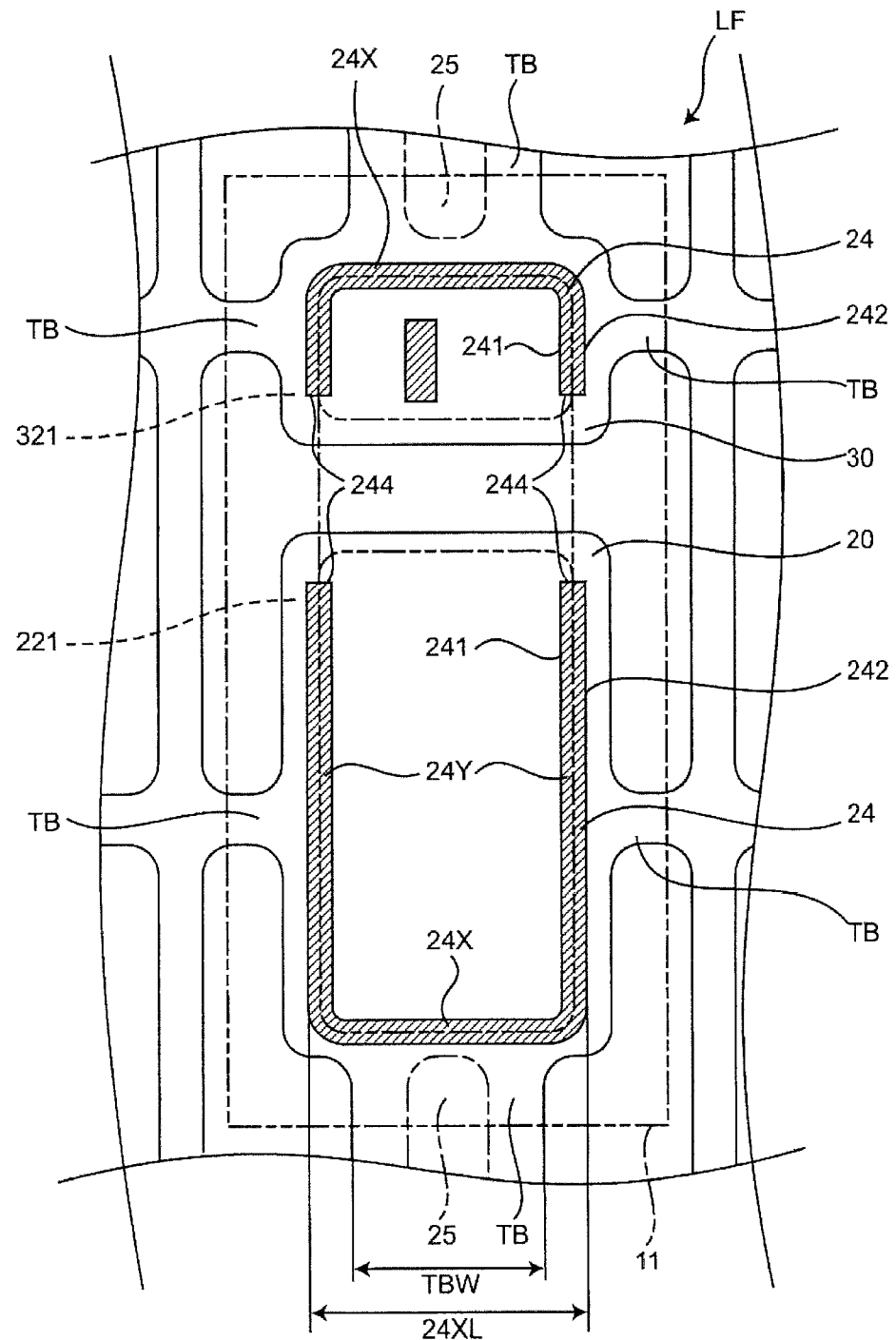
FIG. 9 is a top view illustrating a lead frame to which leads are secured according to the present embodiment.

In the light emitting device 50 of the present embodiment, the grooves 24 are recess portions extending in a belt like shape and have a constant width of openings in the surfaces 21 and 31 of the leads 20 and 30 (i.e., a constant distance between the inside upper edge 241 and the outside upper edge 242). For example, as illustrated in FIG. 9, the groove 24 is provided on each of the leads 20 and 30 such that the groove is formed into a channel shape provided along three sides of each of the leads 20 and 30 and each corresponding inside upper edge 241 and the outside upper edge 242 may be connected at an upper end edge 244 of the groove 24. Since an opening of each groove 24 is enclosed by the inside upper edge 241, the outside upper edge 242, and the upper end edge 244, when the soldering flux entered from the boundaries 61a and 62a enters into the groove 24, the soldering flux needs to climb up to an upper edge of the opening of the groove 24 in order to enter the groove 24. Accordingly, entry of the soldering flux can be better controlled.

Figure 10:
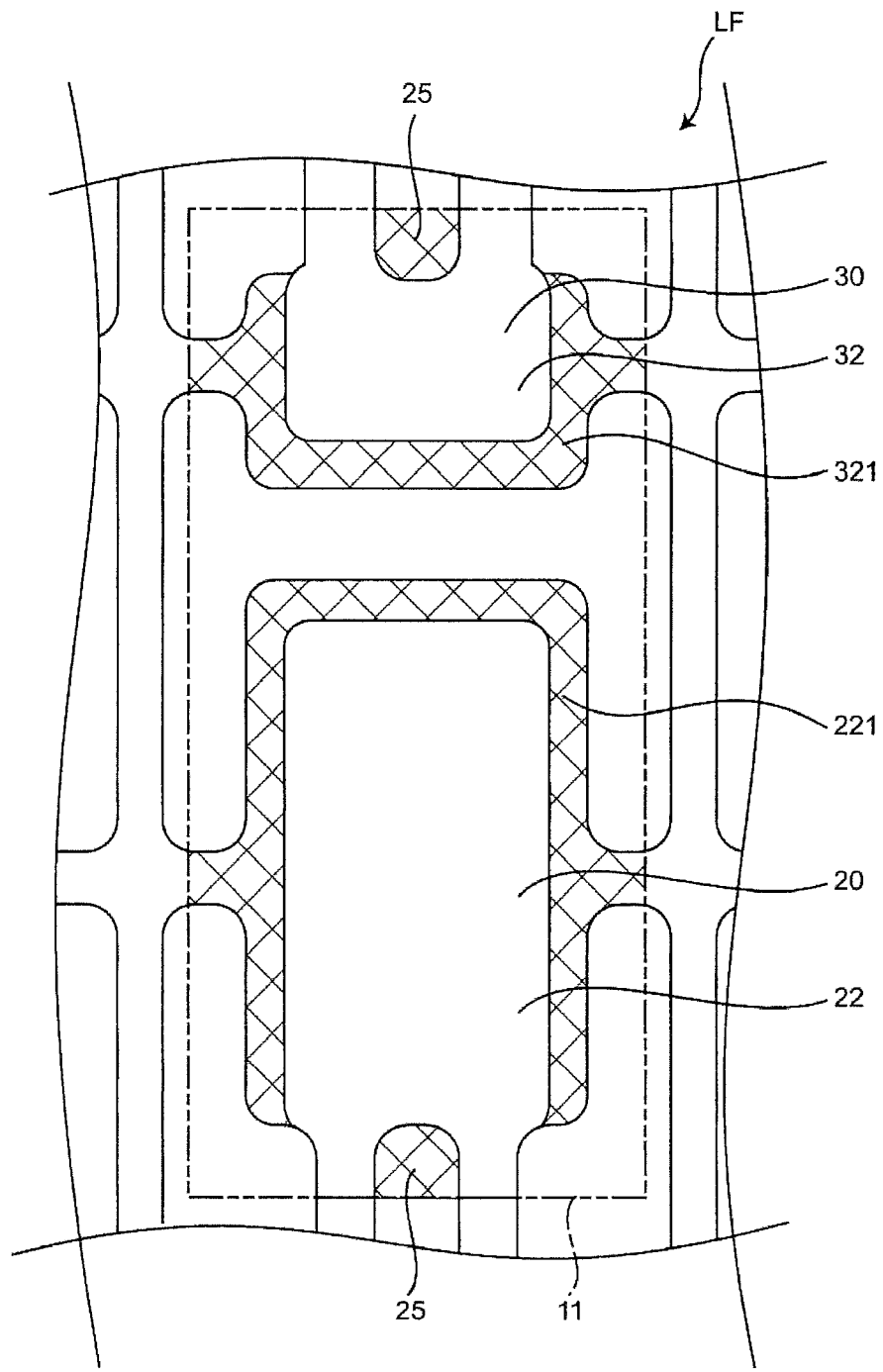
FIG. 10 is a rear surface of the lead frame to which leads are secured according to the present embodiment.
Figure 11A:
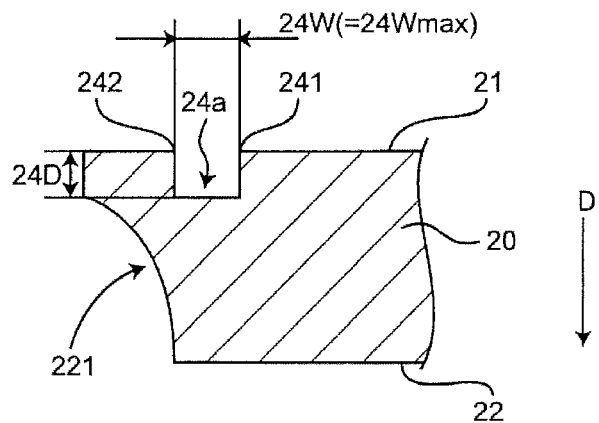
FIGS. 11A to 11C are partial cross sectional views of the leads according to the present embodiment.
Figure 11B:
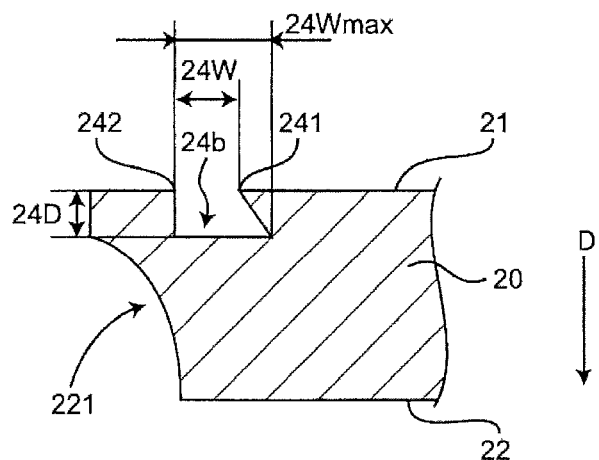
Figure 11C:
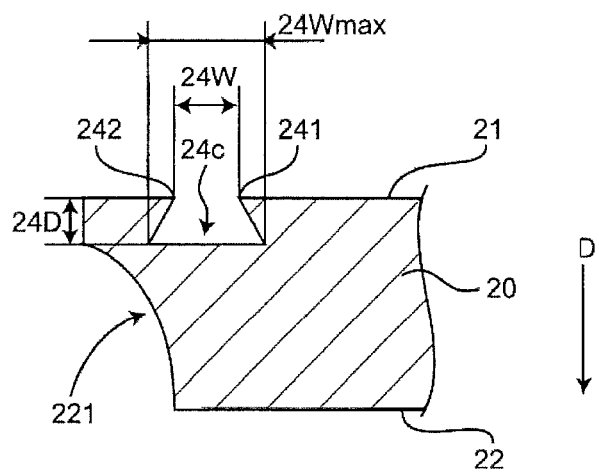

The rear surfaces 22 and 32 of the first lead 20 and the second lead 30 are exposed from the rear surface 14 of the molded resin 11 and are formed into concave portions on the sides of the front surfaces of the leads from the edges of the rear-surface exposed portion. The concave portions (i.e., the rear surface concave portions) 221 and 321 are covered by the molded resin 11 (see, FIG. 10). The peripheral portions of the rear surfaces 22 and 32 of the first lead 20 and the second lead 30 are formed into a canopy shape and, thus, an entry path (i.e., boundary surfaces 61 and 62) through which the soldering flux enters the recess portion 12 during the reflow soldering becomes longer, so that an effect to decrease the entry of the soldering flux to the recess portion 12 can be produced. The "canopy shape" indicates a shape that, as illustrated in FIG. 10, a side of the surface 21 of the lead 20 protrudes more than a side of the rear surface 23 of the lead 20.

When the grooves 24 are formed immediately above the rear surface recess portions 221 and 321, since the thickness of the leads 20 and 30 become remarkably thinner, the strength of the leads 20 and 30 decreases. Thus, preferably, the grooves 24 are formed on positions rather interior of the positions immediately above the rear surface recess portions 221 and 321 (see, FIGS. 7 to 10). However, under the circumstances that the surface areas of the leads 20 and 30 become narrower according to downsizing of the light emitting device 50, the grooves 24 may be formed immediately above the rear surface recess portions 221 and 321 partially or in its entirety.

Figure 12A:
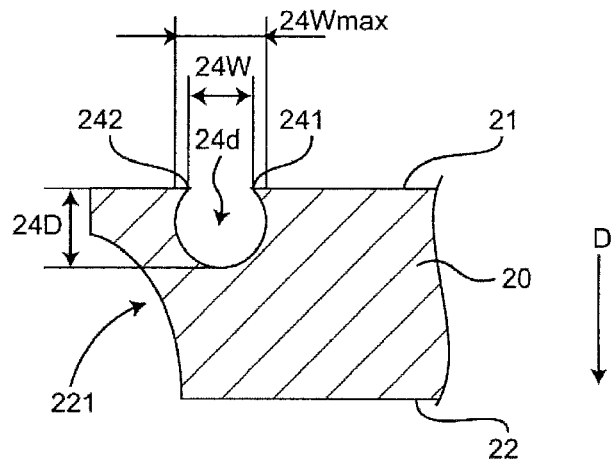
FIGS. 12A to 12C are partial cross sectional views of the leads according to the present embodiment.

In the present embodiment, the "rear surface recess portion" may have an inner surface formed into a curved surface as illustrated in FIGS. 11A to 11C and FIGS. 12A and 12B. Alternatively, the "rear surface recess portion" may be formed into a step as illustrated in FIG. 12C.

Figure 12B:
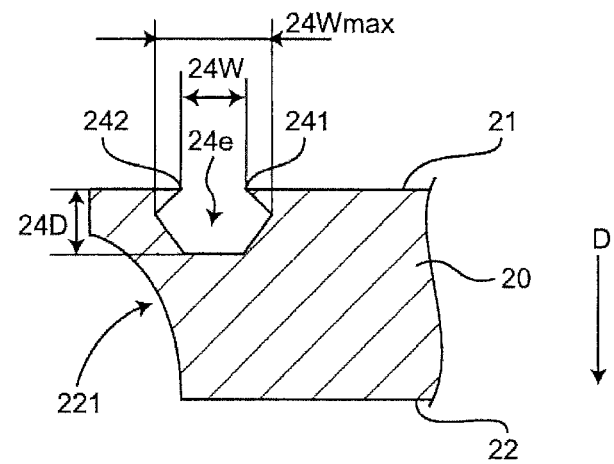
Figure 12C:
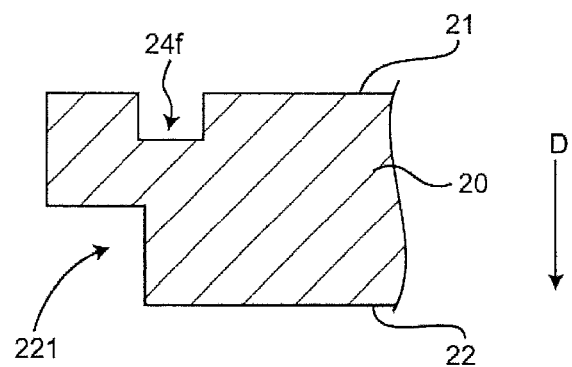

A cross sectional shape of the groove 24 can be formed into various shapes such as a rectangular shape (see, FIGS. 11A and 12C), a trapezoidal shape (see, FIGS. 11B and 11C), a circular shape (see, FIG. 12A), and a polygonal shape (see, FIG. 12B). Preferably, as illustrated in FIGS. 11B and 11C and FIGS. 12A and 12B, the groove 24 has the maximum width 24Wmax larger than a width 24W between the inside upper edge 241 and the outside upper edge 242 in a depth direction D. In the present embodiment, the "depth direction D" is a direction oriented to the rear surfaces 22 and 32 of the first lead 20 from the surfaces 21 and 31 of the first lead 20.

In other words, the groove 24 preferably has a cross section of which maximum width 24Wmax of the inside of the groove 24 is larger than the width 24W of the opening in the surface 21 of the first lead 20. As it is apparent from FIGS. 11A to 11C, in three types of grooves 24a to 24c having the same width 24W of the opening and the same depth 24D of the groove 24 to each other, the grooves 24b and 24c having the cross section of which width 24W is narrower than the maximum width 24Wmax has an inner surface of the groove 24 viewed in cross section longer than the groove 24a having the cross section of which width 24W is equal to the maximum width 24Wmax. Therefore, when the molded package 10 is manufactured by using the lead 20, the entry path through which the soldering flux enters the recess portion 12 (i.e., the boundary surface 61 between the first lead 20 and the molded resin 11) during the reflow soldering becomes longer, resulting in causing the soldering flux to hardly enter the recess portion 12.

When the groove 24 is configured to have a cross section having a width 24W narrower than the maximum width 24Wmax, the maximum width (corresponding to the maximum width 24Wmax of the groove 24) of the portion of the groove filled with the resin 11a filled into the groove 24 becomes larger than the width 24W of the groove 24. Therefore, the portion of the groove filled with the resin 11a shall not come off from the groove 24. As a result thereof, the molded resin 11 can be effectively prevented from being separated from the first lead 20.

As illustrated in FIGS. 12A and 12B, a configuration that the cross section of each of the grooves 24d and 24e becomes narrower from the surface 21 to the rear surface 23 of the lead 20 after once becoming wider enables to decrease an area necessary for the groove 24 in the surface of the lead and also decrease the depth of the groove 24, so that the entry path through which the soldering flux enters the recess portion 12 can be elongated while decreasing the area necessary for forming the groove 24. The groove 24d having a circular shape in its cross section can be formed by wet etching, which, therefore, is suitable for a small light emitting device 50 with which the groove 24 is hardly provided by machining.

The groove 24 and variation of the rear surface recess portion 221 formed on the first lead 20 are described with reference to FIGS. 11 and 12. A similar variation can also be applied to the groove 24 and the rear surface recess portion 221 formed on the second lead 30.

As illustrated in FIG. 1B, the first lead 20 and the second lead 30 are preferred to be exposed from the rear surface 14 to the side surfaces 15 of the molded resin 11. With the above configuration, such an effect can be produced that the light emitting device 50 is not angled with respect to the mounted substrate when the light emitting device 50 is mounted on a mounted substrate (not illustrated). A description is made below as to the effect thereof.

Since the wettability of the molten solder with respect to the molded resin 11 is low, so that, when the light emitting device 50 is mounted, the molten solder gathers to contact the first lead 20 and the second lead 30 exposed from the molded resin 11. When the leads 20 and 30 are exposed only from the rear surface 14 of the molded resin 11, the molten solder gathers only to the rear surface 53 of the light emitting device 50. If an excessive amount of molten solder is applied, the excessive molten solder may partially raise the light emitting device 50 to cause the light emitting device 50 to be mounted in an inclined manner.

To the contrary, if the leads 20 and 30 are exposed from the rear surface 14 continuous to the side surface 15 of the molded resin 11, the molten solder expands to a side surface 54 from a rear surface 53 of the light emitting device 50. Even with the excessive amount of the molten solder, the excessive solder is discharged in a direction of the side surface 54 and thus only a proper amount of solder remains between the rear surface 53 of the light emitting device 50 and the mounted substrate. Therefore, the light emitting device 50 can be prevented from being mounted in an inclined manner. Also, as illustrated in FIGS. 1B and 7, castellations (i.e., recesses) are provided on the rear surfaces 22 and 32 of the leads 20 and 30 exposed from the side surfaces 15. Accordingly, an effect to hold the excessive solder can be enhanced and an area of the contact surface between the molten solder and the leads 20 and 30 can be increased.

As illustrated in FIG. 7, when the leads 20 and 30 are exposed from the respective corresponding opposing side surfaces 15 of the molded resin 11, the soldering flux may enter the boundary surface 61 between the leads 20 and 30 and the molded resin 11 from the boundary 61b exposed from the side surface 15 of the molded resin 11. Therefore, it is preferable to provide the groove 24 on the entry path of the soldering flux from the side surface 15 to prevent the soldering flux entering from the boundary 61b from reaching the recess portion 12. In other words, the groove 24 (i.e., 24X) is preferably formed along a portion 13X of the side wall 13 provided between the side surface 15 and the recess portion 12 of the molded resin 11 (see, FIGS. 2 and 7). Accordingly, the entry of the soldering flux from the side surface 15 can be controlled by the groove 24X.

When both of the grooves 24X and 24Y are formed, it is preferable that the groove 24X and the groove 24Y are connected to each other to be formed into a channel shape (see, FIG. 2). Accordingly, the clearance between the groove 24X and the groove 24Y can be eliminated. As a result thereof, the entry of the soldering flux can be effectively controlled.

As illustrated in FIG. 9, the leads 20 and 30 are connected to the lead frame LF via tie bars TB. The tie bars TB have a width narrower than that of the leads 20 and 30 such that the tie bars TB can be cut later with ease. The leads 20 and 30 exposed from the side surfaces 15 of the molded resin 11 also work as the tie bars TB. Therefore, such a configuration that a length 24XL of the groove 24X is made longer than a width TBW of the tie bars TB can improve an effect to control the entry of the soldering flux from the side surfaces 15.

As illustrated in FIG. 2, if the soldering flux enters from the side wall 13Y opposing to each other near the side surfaces of the light emitting component 40, a light absorption amount from the light emitting component 40 increases. Therefore, as illustrated in FIGS. 6 and 8, it is preferable that the grooves 24Y are formed along the side wall 13Y to generate stresses (i.e., the stress generated due to the thermal expansion of the sealing resin 52 and the portion of the groove filled with the resin 11a) for pressing the areas of sides of the inside upper edges 241 of the portion of the groove filled with the resin 11a during the reflow soldering. In other words, in the molded package 10, the grooves 24Y are preferably formed on the surface 21 of the first lead 20 along the portions 13Y in the adjacent to the portion (i.e., the mounting area) on which the light emitting component 40 is mounted thereon later of the side wall 13. Accordingly the adhesion can be improved between, especially, the portion of the groove filled with the resin 11a and the corresponding bottom surface 243 of the grove 24Y of the boundary surface 61. Therefore, the soldering flux is strongly prevented from entering the area in the adjacent to the light emitting component 40 within the recess portion 12 through the boundary surface 61 from the boundary line 61a during the reflow soldering. As a result thereof, the entry of the soldering flux from the side wall 13Y can be controlled by the groove 24Y.

Preferably, the first lead 20 is provided with an additional groove 24Z on the surface 21 of the first lead 20 along a side 26 of the first lead positioned opposite side of the second lead 30 (see, FIG. 6). The additional groove 24Z is entirely exposed from the bottom surface 121 of the recess portion 12 of the molded resin 11. With the additional groove 24Z, such an effect is produced that the soldering flux entered from a side 26 can be prevented from reaching the light emitting component 40 based on the following reason.

As illustrated in FIG. 2, the light emitting component 40 may be disposed near the side 26. Since the soldering flux absorbs light, it is material to control the soldering flux so as not to reach the area near the light emitting component 40 even when the soldering flux enters from the side 26. When the additional groove 24Z is not formed, the soldering flux entering the side 26 through the boundary surface 63 between the first lead 20 and the molded resin 11 from the rear surface 14 of the molded resin 11 can enter the mounting area for mounting the light emitting component 40 along the boundary surface 64 between the surface 21 of the first lead 20 and the sealing resin 52.

As illustrated in FIGS. 6 and 7, it is preferable to form the additional groove 24Z on the first lead 20 and fill a portion of the molded resin 11 (i.e., the portion of the groove filled with the resin 11a) into the additional groove 24Z. The sealing resin 52 is well bonded to the molded resin 11 within the additional groove 24Z, so that the soldering flux cannot enter between the sealing resin 52 and the molded resin 11. In other words, the entry path of the soldering flux is caused to detour along the additional groove 24Z. In the portion of the groove filled with the resin 11a in the groove 24Z, the stress $F_1$ for pressing downwardly (i.e., toward the bottom surface 243 of the groove 24Z) is generated due to the thermal expansion of the sealing resin 52 and the portion of the groove filled with the resin 11a during the reflow soldering. Accordingly, the adhesion becomes stronger at a position, especially, between the portion of the groove filled with the resin 11a and the bottom surface 243 of the groove 24Z of the boundary surface 61, and thus the entry of the soldering flux can be highly controlled. As a result thereof, the soldering flux can be prevented from being entered from the boundary surface 63 by the groove 24Z.

In a small-sized light emitting device 50, since an area of the second lead 30 is small, formation of the additional groove on the second lead 30 is considered as being difficult; however, the additional groove may also be formed on the second lead 30.

A method for manufacturing the light emitting device 50 will be described below.

1. Manufacturing of Molded Package 10

A lead frame LF having a plurality of pairs of the first lead 20 and the second lead 30 is formed by punching a metal plate, the first lead 20 and the second lead 30 being opposed to each other in the lead frame LF. The first lead 20 and the second lead 30 are connected to the lead frame LF via the tie bars TB. Then, the grooves 24 are formed at predetermined positions of the first lead 20 and the second lead 30 according to the wet etching. The lead frame LF is held by a metal mold 90 having clearances for the molded resin 11 at positions corresponding to the respective lead pairs. Then, a resin material for the molded resin 11 is injected into the clearance of the metal mold 90. After the resin material is cured, the metal mold 90 is removed to obtain the molded package 10 fixed to the lead frame LF.

2. Mounting of Light Emitting Component 40

Each of the light emitting components 40 (41, 42) illustrated in FIG. 2 is provided with a pair of electrodes on the upper surface thereof. In the light emitting components 40, the light emitting components 40 are mounted on the first lead 20 of the molded package 10 via the die bonding.

As illustrated in FIG. 2, the first electrode (e.g., a p-side electrode) of the first light emitting component 41 is connected to the first lead 20 via the bonding wire BW. The second electrode (e.g., an n-side electrode) of the first light emitting component 41 is connected to the first electrode (e.g., a p-side electrode) of the second light emitting component 42 via the bonding wire BW. The second electrode (e.g., an n-side electrode) of the second light emitting component 42 is connected to the second lead 30 via the bonding wire BW. Accordingly, the first light emitting component 41 and the second light emitting component 42 are connected in series via the bonding wire BW.

The first electrodes (e.g., the p-side electrodes) of the first light emitting component 41 and the second light emitting component 42 are connected to the first lead 20 via the bonding wire BW and the second electrodes thereof (e.g., the n-side electrode) also can be connected to the second lead 30 via the bonding wire BW. Accordingly, the first light emitting component 41 and the second light emitting component 42 are connected in parallel via the bonding wire BW.

The light emitting component provided with the first electrode on its upper surface and the second electrode on its lower surface can also be employed. In this case, the lower surface is fixed to the first lead 20 by using conductive paste, thereby electrically connecting the second electrode with the first lead 20. The first electrode provided on the upper surface is electrically connected to the second lead 30 by using the bonding wire BW.

3. Mounting of Zener Diode 43

Each of the zener diodes 43 illustrated in FIG. 2 is provided with the first electrode (e.g., the p-side electrode)

on its upper surface and the second electrode (e.g., the n-side electrode) on its lower surface. The lower surface of the zener diode 43 is fixed to the second lead 30 by using the conductive paste, thereby electrically connecting the second electrode with the second lead 30. The first electrode provided on the upper surface is electrically connected to the first lead 20 by using the bonding wire BW.

4. Filling of Sealing Resin 52

The sealing resin in a liquid state is provided in the recess portion 12 of the molded package 10 by potting, followed by curing thereof. When the sealing resin is made into a double layer, a first sealing resin (e.g., an underfill resin) is provided in the recess portion 12 by potting to cure the first sealing resin and, subsequently, the second sealing resin (e.g., an overfill resin) is provided in the recess portion 12 by potting to cure the second sealing resin.

5. Division of Light Emitting Devices 50

The tie bars TB of the lead frame LF are cut along an outer surface of the molded resin 11 by dicing to divide the light emitting devices 50 into pieces.

A material suitable for each composition member of the light emitting device 50 is described below.

First Lead 20 and Second Lead 30

The first lead 20 and the second lead 30 may be manufactured by using a conductive member including at least one or more of aluminum, iron, nickel, and copper in view of the processability and the strength of the resulting products. Preferably, the first lead 20 and the second lead 30 are plated by using gold, silver, or an alloy thereof.

Molded Resin 11

Examples of the molding material of the molded resin 11 include a thermosetting resin such as an epoxy resin, a silicone resin; and a thermoplastic resin such as a liquid crystal polymer, a polyphthalamide resin and polybutylene telephthalate (PBT). Further, a white pigment such as titanium oxide is mixed into the molding material to improve a light reflection ratio within the recess portion 12 of the molded resin 11.

Bonding Wire BW

A metal-made wire made of a metal of, for example, gold, silver, copper, platinum, and aluminum, and alloys thereof can be used as the bonding wire BW.

Sealing Resin 52

A silicone resin, an epoxy resin, an acrylic resin, or a resin containing at least one of the above resins can be used as a material of the sealing resin. The sealing resin 52 can be formed into a single layer or can be formed into a multi-layer (e.g., a double layer composed of the underfill and the overcoat).

Light scattering particles such as titanium oxide, silicone dioxide, titanium dioxide, zirconium dioxide, alumina, and aluminum nitride may be dispersed within the sealing resin 52.

Particles of a material which converts a wavelength of light emitted from the light emitting element 40 (e.g., phosphor) may be dispersed within the sealing resin 52. For example, in the light emitting device 50 for emitting white light, the light emitting element 40 for emitting blue light and phosphor particles for absorbing blue light to emit yellow light (e.g., YAG particles) can be combined.

Solder

Examples of the solder to be used in the present embodiment can include Sn—Ag—Cu, Sn—Zi-Bi, Sn—Cu, Pb—Sn, Au—Sn, and Au—Ag.

Modification

Figure 13A:
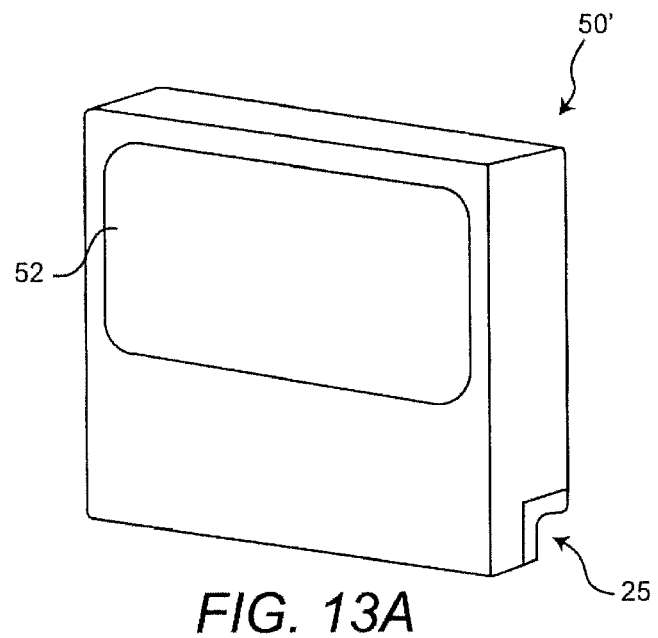
FIG. 13A is a perspective view of a front surface of a modification of the light emitting device according to the present embodiment and FIG. 13B is a perspective view of a rear surface of the same.
Figure 13B:
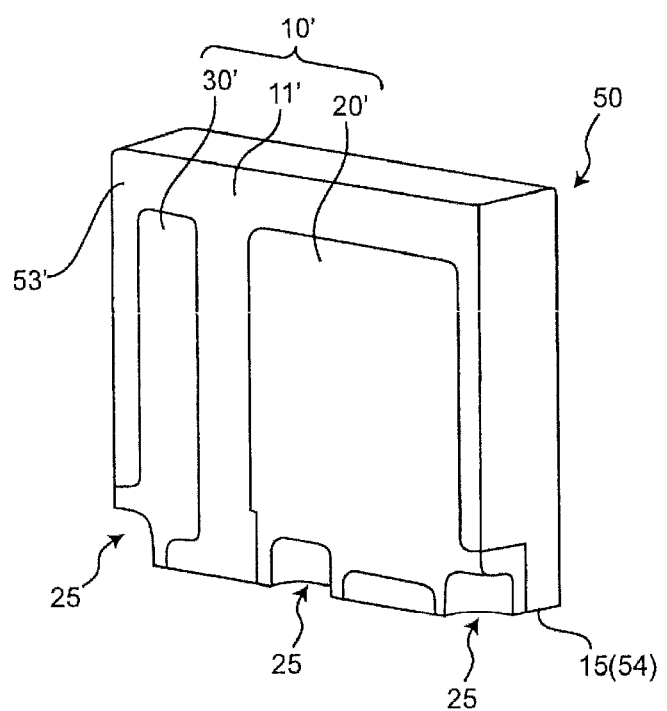

FIG. 1 illustrates the light emitting device 50 of a type fixed to the mounted substrate (not illustrated) at a side of the rear surface 53 of the light emitting device 50. However, also in the light emitting device 50' illustrated in FIG. 13, the grooves can also be provided on the surfaces of the leads. The light emitting device 50' differs from the light emitting device 50 of FIG. 1 in that both of the first lead 20' and the second lead 30' are exposed from the same side surface 54 so as to allow the side surface 54 to be fixed to the mounted substrate. The other configurations of the light emitting device 50' are identical to those of the light emitting device 50 of FIG. 1.

Example

As one example, the molded package 10 and a comparative molded package 100 are manufactured in order to confirm presence or absence of the generation of the burr 80.

The manufacturing method of the molded package 10 according to the example will be described below. Firstly, the lead frame LF connected to the first lead 20 and the second lead 30 via the tie bars TB is subjected to wet etching to form the grooves 24 at predetermined positions and thereafter the lead frame LF is held by the metal mold 90, thereby forming an assembly of the molded packages 10 by injecting a resin into the metal mold 90. Then, the molded resin 11 and the tie bars TB are cut along predetermined positions by dicing to divide the molded packages 10 into pieces.

The comparative molded package 100 is manufactured in the same manner as the molded package 10 according to the example except for omitting the process of forming the grooves 24 at the predetermined positions by subjecting to the wet etching.

Figure 14B:
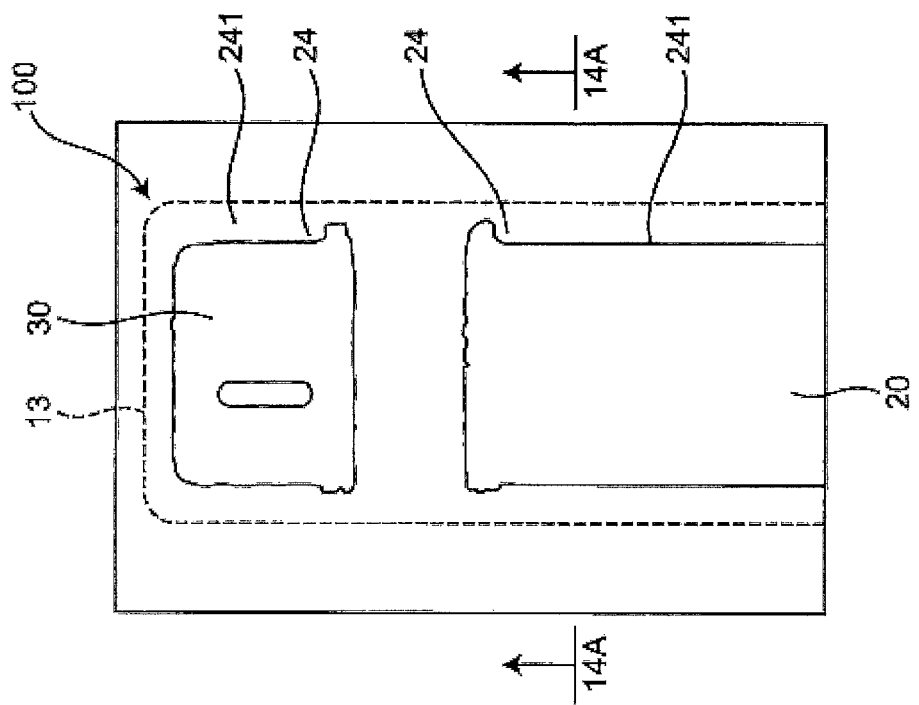
FIG. 14A is a line drawing of a photograph of a front surface of a comparative molded package and FIG. 14B is a line drawing of a photograph of a front surface of the molded package according to the present embodiment.
Figure 14A:
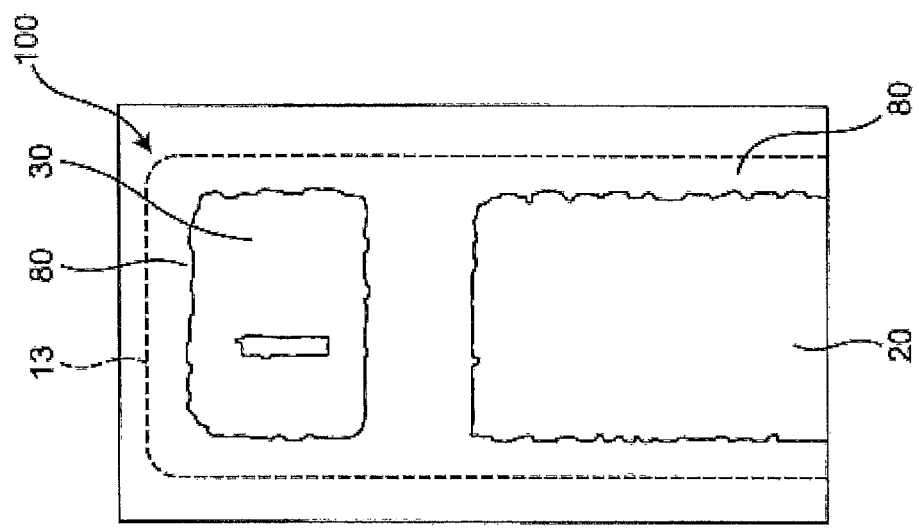
Figure 15:
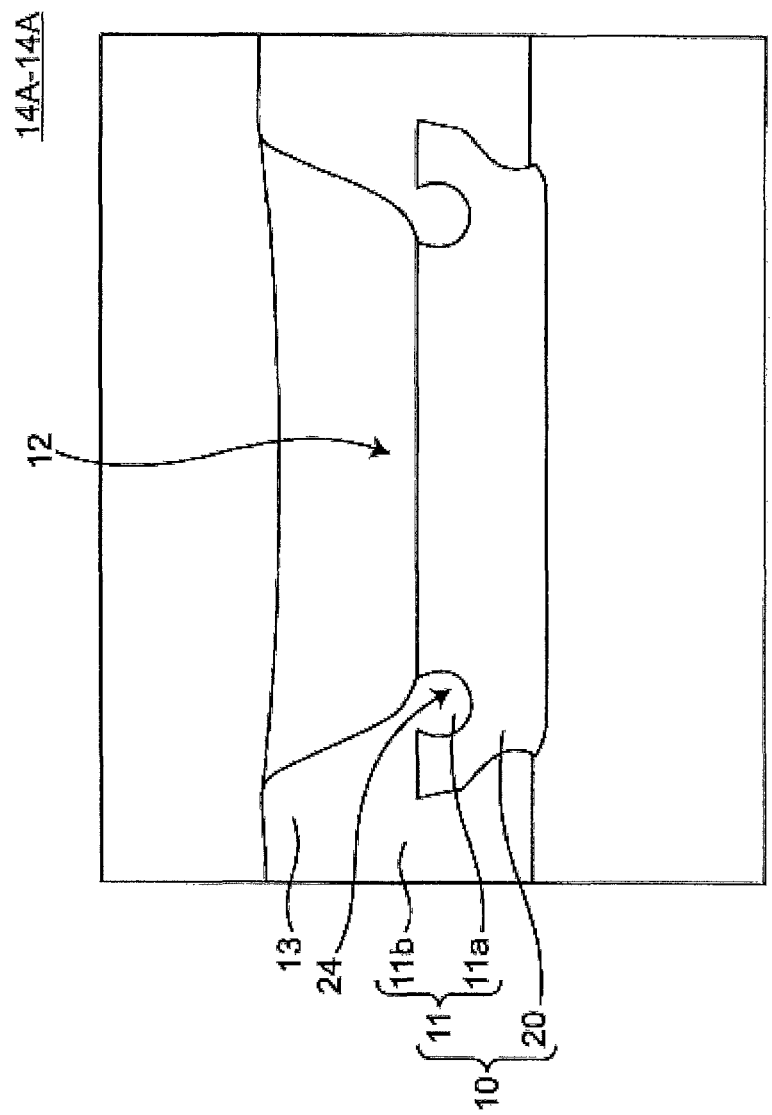
FIG. 15 is a line drawing of a photograph of a cross section of the molded package according to the present embodiment.

As illustrated in FIG. 14A, in the comparative molded package 100, the burr 80 is generated between the leads 20 and 30 and the side wall 13 of the molded resin 11. On the other hand, as illustrated in FIGS. 14B and 15, no burr was generated in the molded package 10 according to the example.

In the molded package according to the present embodiment, the inside upper edge of the groove is exposed from the bottom surface of the recess portion of the molded resin and the outside upper edge of the groove is embedded within the molded resin. The groove is filled with the molded resin. Therefore, when viewed in cross section, the molded resin filled in the groove (i.e., a portion of the groove filled with the resin) is connected to a body of the molded resin at a side of the outside upper edge and is exposed from the bottom surface of the recess portion at a side of the inside upper edge.

In a case of manufacturing the light emitting device by using the above described molded package, the recess portion of the molded package is sealed with the sealing resin. After the sealing of the molded package, if the light emitting device is subjected to reflow soldering, the sealing resin expands within the recess portion to press the side wall of the recess portion and the bottom surface, respectively, outwardly and downwardly. Further, since the molded resin also expands, the portion of the groove filled with the resin presses the side surfaces and the bottom surface within the groove. Still further, the portion of the groove filled with the resin is pressed by the expanded sealing resin since it is contacting the sealing resin. In other words, owing to the synergistic effect between the expansion of the sealing resin and the expansion of the portion of the groove filled with the resin, a stress that the portion of the groove filled with the resin applies downwardly (i.e., toward the bottom surface of the groove) increases.

Upon invasion of the soldering flux, the soldering flux passes through between the portion of the groove filled with the resin and the bottom surface of the groove. However, while the soldering flux is in a molten state (i.e., is subjected to the reflow soldering), since the portion of the groove filled with the resin is pressed toward the bottom surface of the groove due to the expansion of the sealing resin and the portion of the groove filled with the resin, adhesion, especially, between the portion of the groove filled with the resin and the bottom surface of the groove in the boundary surface becomes stronger, which exercises higher resistant against the invasion of the soldering flux.

In the molded package of the present embodiment, the groove comes to position immediately below the corners of the convex portion of the upper metal mold during the molding of the molded resin. Therefore, even with the corners of the convex portion being subjected to the chamfering processing, clearances having a sharp angle cannot be formed between the corner and the corresponding lead. Therefore, the molten resin is prevented from being oozed out into the metal mold-lead contact area, resulting in preventing the burr from being formed.

As described above, according to the molded package of the present embodiment, when the molded package is used in the light emitting device, the soldering flux can be effectively prevented from entering the recess portion of the molded package as well as the burr of the molded resin can be prevented from being generated within the recess portion.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device comprising:
   providing a plurality of molded packages, each of the molded packages having a recess;
   mounting a light emitting component on a bottom surface of the recess of each of the molded packages; and
   forming at least one sealing member covering the light emitting component within the recess of each of the molded packages,
   wherein the plurality of molded packages are provided by:
   providing a lead frame including a plurality of pairs of leads, each of the pairs of leads including a first lead having a first groove on an upper surface of the first lead and a second lead having a second groove on an upper surface of the second lead;
   forming a plurality of spaces, each of the spaces being surrounded with an upper metal mold, a lower metal mold, and the lead frame by cooperatively holding the lead frame with the upper metal mold and the lower metal mold, wherein the upper metal mold has a plurality of convex portions on a lower surface of the upper metal mold, each of the convex portions having chamfered corners at a lower surface of each of the convex portions, wherein the lower surface of each of the convex portions is in contact with upper surfaces of each of the pairs of leads so that the chamfered corners of the convex portion face to the first groove and the second groove of each of the pairs of leads, wherein an upper surface of the lower metal mold is in contact with lower surfaces of the plurality of the pairs of leads, and wherein each of the spaces is connected with the first groove and the second groove of each of the pair of leads; and
   filling with a resin the plurality of the spaces and the first groove and the second groove of the plurality of the pairs of leads.

2. The method according to claim 1, wherein the lead frame is provided by forming the first groove on the upper surface of the first lead and the second groove on the upper surface of the second lead, respectively, by wet etching.

3. The method according to claim 1, wherein the first groove has a first opening at an upper surface of the first groove, a width of the first opening being smaller than a maximum width of the inside of the first groove, and
   wherein the second groove has a second opening at an upper surface of the second groove, a width of the second opening being smaller than a maximum width of the inside of the second groove.

4. The method according to claim 1, wherein the at least one sealing member includes a first sealing member and a second sealing member, and
   wherein the sealing member is formed by:
   forming the first sealing member within the recess of each of the molded packages; and
   forming the second sealing member on the first sealing member within the recess.

5. The method according to claim 1, wherein the first lead and the second lead of each of the pair of leads in each of the molded packages is continuously exposed from a molded resin at a rear surface and a side surface of each of the molded packages.

* * * * *